US011428725B2

(12) United States Patent
Herlihy et al.

(10) Patent No.: US 11,428,725 B2
(45) Date of Patent: Aug. 30, 2022

(54) WIRELESS POWER INITIATED AIRCRAFT TEST SYSTEM

(71) Applicant: PERFORMANCE DRONE WORKS LLC, Huntsville, AL (US)

(72) Inventors: Phil Herlihy, New York, NY (US); Nate Ferris, New York, NY (US); Trevor Smith, New York, NY (US); Ryan Gury, New York, NY (US); Nicholas Horbaczewski, New York, NY (US)

(73) Assignee: Performance Drone Works LLC, Huntsville, AL (US)

( * ) Notice: Subject to any disclaimer, the term of this patent is extended or adjusted under 35 U.S.C. 154(b) by 727 days.

(21) Appl. No.: 15/709,268

(22) Filed: Sep. 19, 2017

(65) Prior Publication Data
US 2019/0086463 A1 Mar. 21, 2019

(51) Int. Cl.
*G01R 31/00* (2006.01)
*G05B 23/02* (2006.01)
*B64F 5/60* (2017.01)
*B64C 39/02* (2006.01)
*H02J 7/02* (2016.01)
*H02J 50/10* (2016.01)

(52) U.S. Cl.
CPC .......... *G01R 31/008* (2013.01); *B64C 39/024* (2013.01); *B64F 5/60* (2017.01); *G05B 23/0205* (2013.01); *H02J 7/025* (2013.01); *H02J 50/10* (2016.02); *B64D 2221/00* (2013.01)

(58) Field of Classification Search
None
See application file for complete search history.

(56) References Cited

U.S. PATENT DOCUMENTS

2016/0056664 A1* 2/2016 Partovi ................. H02J 50/005
                                                    307/104
2016/0244187 A1* 8/2016 Byers ..................... A47G 29/14
2016/0376031 A1  12/2016 Michalski
2017/0240061 A1* 8/2017 Waters .................. B60L 53/126
2018/0309314 A1* 10/2018 White, II .............. H02J 50/40
2018/0331586 A1* 11/2018 Hao ...................... H04B 5/0031

OTHER PUBLICATIONS

PCT International Search Report and Written Opinion of the International Searching Authority, dated Dec. 6, 2018, PCT Patent Application PCT/US2018/047489.

* cited by examiner

*Primary Examiner* — Christian Chace
*Assistant Examiner* — Katherine Marie Fitzharris
(74) *Attorney, Agent, or Firm* — Vierra Magen Marcus LLP

(57) ABSTRACT

A wireless power initiated test system can use an aircraft controller to automatically initiate a test sequence to determine status of systems of the aircraft, based on the detection of receipt of the wireless power at the aircraft. The detection of receipt of the wireless power at the aircraft can be based on the detection at a voltage regulator of the aircraft which is receiving the wireless power from a wireless power receiver of the aircraft. The system may also power the aircraft controller during the test sequence using the wireless power received. Such a system may quickly and efficiently initiate, power and perform a pre-flight test sequence to determine statuses of systems of the aircraft, such as during a competition or race of the aircraft. The system may apply to drones, as well as of other types of aircraft.

12 Claims, 9 Drawing Sheets

WIRELESS POWER INITIATED AIRCRAFT TEST SYSTEM

BACKGROUND

Aircraft test systems, such as pre-flight test systems are used to determine statuses of systems of the aircraft prior to takeoff. These systems may be used to assure the airworthiness of the aircraft for takeoff and flight by inspecting or testing the aircraft's electrical system, propulsion systems, communication systems, flight control systems, flight surfaces and power systems.

However, some existing aircraft test systems may not satisfactorily test the statuses of systems of an aircraft. For example, existing pre-flight test systems may not quickly and efficiently initiate and perform a pre-flight test sequence to determine statuses of systems of a high speed radio controlled unmanned aircraft (i.e., a drone). Such pre-flight testing may be important during certain events such as when the aircraft is used for security, deliveries or competitions.

DETAILED DESCRIPTION

Figure 1:
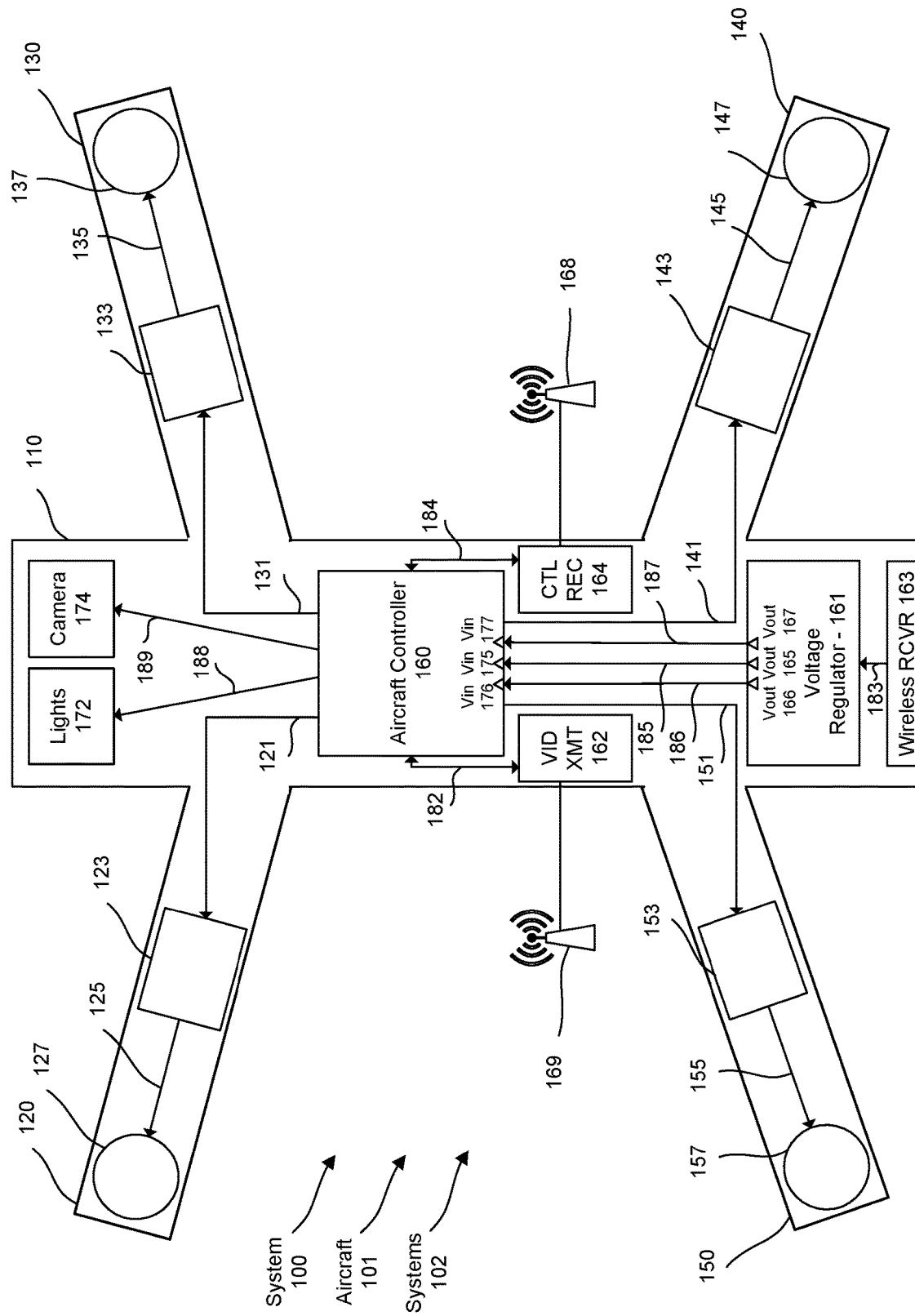
FIG. 1 is a block diagram of one embodiment of a system for initiating a test of an aircraft based on detection of wireless power at the aircraft.

Pre-flight testing of an aircraft, such as a high speed radio controlled unmanned aircraft (i.e., drone), may require manually initiating a test of the aircraft systems, powering the aircraft systems with the aircraft battery to perform the test, connecting the electronic systems of the aircraft to a test computer to determine test results, connecting the aircraft to other equipment and/or performing other manual steps. This type of testing can be expensive, complicated, time consuming and frustrating.

One embodiment of a proposed solution for pre-flight testing of an aircraft is an automatic wireless power initiated test system that initiates a test sequence to determine statuses of systems of the aircraft in response to the receipt of wireless power at the aircraft. The system may also power the aircraft controller and test sequence using the wireless power received at the aircraft. It is considered that the system may automatically perform this initiating and powering for aircraft, such as drones, as well as of other types of aircraft. The system may quickly and efficiently initiate, power and perform the pre-flight test sequence during important events, such as during a competition or race of the aircraft.

For example, a wireless power initiated test system can use a voltage regulator mounted on an aircraft to detect receiving wireless power at the aircraft from a source or transmitter of the wireless power. The voltage regulator may detect the receipt of wireless power at an electrical connection to a wireless power receiver of the aircraft that receives the wireless power and sends the power to the connection. The regulator can also be electrically connected to an aircraft controller on the aircraft that can initiate a test sequence to determine statuses of systems of the aircraft, based on the detection of the receipt of the wireless power. In addition, the aircraft controller may be powered by the wireless power received when it is conducting the test sequence. The system may include a test pad or a "drone verification pad" that has the source or transmitter of the wireless power. Consequently, in one example, the test system may automatically initiate and power a pre-flight test sequence to test aircraft systems of a drone during or after initialization of the drone's electrical systems, prior to a competition or race of the drone.

More particularly, prior to receiving wireless power from the source, the aircraft's electrical systems, such as the aircraft controller, may be powered down. The aircraft may be located proximate to the source, such as by being put onto or above the test pad, prior to or while the source is transmitting the wireless power. The aircraft's electrical systems may then be initialized, such as when the wireless power is detected at the aircraft to initiate the test sequence.

In some instances, part of detecting the wireless power may include the wireless power receiver detecting a power signature of received wireless power, and the voltage regulator detecting an amount of power of the received wireless power. The voltage regulator may then automatically switch on the aircraft controller based on the receiver detecting that the power signature of the received wireless power matches a power signature of the wireless power receiver, and the regulator detecting that the amount of power of the received wireless power exceeds a threshold amount of power needed to power the aircraft controller during the test. Switching on the controller may cause the controller to automatically initiate the test sequence to test the aircraft systems.

After automatic initiation of the test sequence, the aircraft controller may conduct the test sequence to determine statuses of systems of the aircraft while being powered by the wireless power received. The sequence may test various aircraft systems such as aircraft lights, video camera output, video data radio transmitter, control signal radio receiver, electronic speed controllers (ESCs) of motors that provide propulsion for the aircraft, and the motors. If any of these systems fail the test, the aircraft may be considered unfit to fly or perform.

As noted, the source may be a wireless power transmitter that is part of a test pad. In some embodiments, the transmitter is electrically connected to a current detector of the pad that is electrically connected to a pad controller of the pad. The current detector may detect if an amount of electrical current flowing to the transmitter (e.g., being consumed by the aircraft) is greater than a minimum current threshold for powering the aircraft controller, and/or is less than a maximum current threshold indicating damage to the systems of the aircraft. If an amount of electrical current flowing to the transmitter is less than the minimum current threshold the test may be discontinued. If it is greater than the maximum current threshold the aircraft may be considered damaged, and unfit to fly or compete. This system will provide less expensive, more accurate, faster, less complicated automated testing of the aircraft systems.

For example, FIG. 1 is a block diagram of one embodiment of system 100 for initiating a test of aircraft 101 based on detection of wireless power at the aircraft, showing aircraft systems 102 which are components of aircraft 101. For example, aircraft 101 is shown having the following aircraft systems 102: aircraft controller 160, voltage regulator 161, video transmitter 162, wireless power receiver 163, control receiver 164, lights 172, and camera 173. Aircraft systems 102 also include electronic speed controllers (ESCs) 123, 133, 143 and 153; and propulsion sources 127, 137, 147 and 157. Aircraft controller 160 may be used to electrically control the other aircraft systems, during flight or during aircraft system testing, such as using electrical control signals sent through electrical connections to the other aircraft systems. Aircraft systems 102 may include additional components as will be discussed further below in FIGS. 3-4A. Some components of FIGS. 1-4B are the same component and are identified as such by having the same reference number in the figures. In one embodiment, system 100 is a wireless power initiated test system that is configured to initiate a test sequence to determine statuses of systems 102 of the aircraft, based on the detection of receipt of the wireless power.

Structurally, aircraft 101 is shown having central aircraft body 110 and arms 120, 130, 140 and 150 extending outward from sides of body 110 to propulsion sources 127, 137, 147 and 157. For example, aircraft 101 has arm 120 with a proximal end attached to (or integral with) one side surface of aircraft body 110, and arm surfaces extending outwards to a distal end of arm 120 at (or upon) which propulsion source 127 is mounted. Aircraft 101 also, has arm 130 with a proximal end attached to (or integral with) an opposing side surface of body 110 (e.g., opposite to the side surface upon which arm 120 is attached) and arm surfaces extending outwards to a distal end of arm 130 at which propulsion source 137 is mounted. In addition, aircraft 101 has arm 140 with a proximal end attached to the side surface of body 110 upon which arm 120 is mounted, and arm surfaces extending outwards to a distal end of arm 140 at which propulsion source 147 is mounted. Next, aircraft 101 has arm 150 with a proximal end attached to the side surface of body 110 upon which arm 130 is mounted, and arm surfaces extending outwards to a distal end of arm 150 at which propulsion source 157 is mounted.

Arms 120, 130, 140 and 150 may also include ESCs 123, 133, 143 and 153 such as electrical circuits each having an input electrically connected thorough electrical connections 121, 131, 141 and 151 respectively, to an output of aircraft controller 160 that provides ESC control signals. The ESCs may have an output electrically connected through electrical connections 125, 135, 145 and 155 respectively, that provide propulsion driver signals to an input of propulsion sources 127, 137, 147 and 157. Although ESCs 123, 133, 143 and 153 are shown mounted on or in the arms, they may be mounted on or in body 110.

Propulsion sources 127, 137, 147 and 157 may provide propulsion used to fly aircraft 101. They may be powered by a battery (not shown) mounted on or in the aircraft, and may be controlled by ESCs 123, 133, 143 and 153 through via the control signals received by the ESCs from controller 160. Propulsion sources 127, 137, 147 and 157 may be motors having propellers mounted on them such as on rotating shafts of the motors.

Controller 160 may be mounted on (or in) aircraft 101, such as by being mounted inside of body 110. As noted, controller 160 may be used to control systems 102. For example, FIG. 1 shows video transmitter 162 electrically connected to controller 160 electrical connection 182. Video transmitter 162 may be part of a radio frequency (RF) link mounted on aircraft 101, and may be capable of transmitting video data signals to a video data receiver radio that is part of a ground station, tower or other structure having a video data radio link that communicates with the aircraft link. Transmitter 162 may be mounted inside of body 110. Transmitter 162 may receive video data signals of camera 174 from controller 160 through the electrical connection between the controller and transmitter, and transmit the video data signals in RF signals. Receipt of the transmission of the video data RF signals may be confirmed when transmitter 162 receives a confirmation signal from the video data receiver radio, in response to the receiver receiving the transmitted signals. Transmitter 162 may send the confirmation signals to controller 160 through electrical connection 182 between them. Transmitter 162 (or its aircraft link) includes RF antenna 168 through which these RF signals are transmitted and received.

FIG. 1 further shows control receiver 164 electrically connected to controller 160 electrical connection 184. Control receiver 164 may also be part of a radio frequency (RF) link mounted on aircraft 101, and may be capable of receiving flight control data signals from a flight control data transmission radio that is part of a ground station, tower or other structure having a flight control data radio link that communicates with the aircraft link. Receiver 164 may be mounted inside of body 110. Receiver 164 may send the received control data signals to controller 160 through the electrical connection between them. Receipt of the flight control data signals at receiver 164 may be confirmed by receiver 164 transmitting confirmation signals to the flight control data transmission radio. Receiver 164 may receive the confirmation signals from controller 160 through electrical connection 184 between them. Receiver 164 (or its aircraft link) includes RF antenna 169 through which these RF signals are received and transmitted.

Lights 172 are connected to controller 160 through electrical connection 188. Lights 172 may be lights capable of illuminating with one or more colors. In some case, they are light emitting diode (LED) lights mounted on aircraft 101. They may be mounted through (or on) front, back, top, bottom and/or side surfaces of body 110. In some cases, they may also be located on the arms of the aircraft. They may be "segments" or rows of lights, such as rows of between 5 and 15 LEDs, at each location. They may all be capable of illuminating or blinking with the same color at the same time, such as to indicate that aircraft 101 is a particular aircraft in a competition and/or to indicate results of the test of systems 102. Lights 172 may receive light control signals turning them on/off and selecting a color from controller 160 through electrical connection 188.

Camera 174 is mounted on aircraft 101 and connected to controller 160 through electrical connection 189. Camera 174 may be a video camera capable of capturing images, such as video frames, at a frame rate that is fast enough to allow a pilot to fly aircraft 101. The pilot may fly aircraft using a remote control device sending control signals to receiver 164, while watching the video from camera 174 sent by transmitter 162, at a location from which the pilot may not be able to view the actual aircraft. The camera may be a high speed video camera such as a charge-coupled device (CCD) or complementary metal-oxide-semiconductor (CMOS) camera. In some case, it may be mounted through or onto a front surface of body 110. It may transmit video data signals including the video images/frames to controller 160 through electrical connection 189.

Voltage regulator 161 is also mounted on or in aircraft 101, and is electrically connected to controller 160 though electrical connections 185, 186 and 187. At certain times, regulator 161 and other circuitry of aircraft 101 may convert voltage from a battery of the aircraft (not shown) to various voltage levels that are used to power aircraft systems 102, and possibly other systems of aircraft 101, prior to and/or during flight of the aircraft. The battery may provide enough power to power the aircraft systems during flight for a desired period of time, which may include during a competition or race of the aircraft.

In some instances, as part of system 100, wireless power receiver 163 is mounted on or in aircraft 101, and is electrically connected to voltage regulator 161 though electrical connection 183. Receiver 163 may be a wireless power receiver configured to receive inductive wireless power from a source of wireless power, and convert the wireless power to one or more power (e.g., voltage) output signals. Receiver 163 may be mounted on or inside a bottom surface of body 110, such as by glue or adhesive. Receiver 163 may send a power output signal to regulator 161 through electrical connection 183 between them.

In some embodiments, as part of system 100, voltage regulator 161 may be electrically connected to controller 160 to send power signals to the controller though electrical connections 185, 186 and 187. It may also be electrically connected through connection 183 to receiver 163 to receive a power output signal from receiver 163 that is power of or converted from wireless power received at the receiver. Regulator may convert the power output signal from receiver 163 into voltage output signals Vout 165, 166 and 167 which are sent through electrical connections 185, 186 and 187, respectively, to voltage input signals Vin 175, 176 and 177 respectively, of controller 160. These voltage input signals may be used by controller 160 to power systems 102 and/or to detect receipt of wireless power at aircraft 101.

In some cases, as part of system 100, aircraft controller 160 is electrically connected to regulator 161 as well as to the other systems of aircraft systems 102. Controller 160 may be a computer controller (e.g., a microcontroller) that includes firmware (e.g., ROM data). The controller may have circuitry for automatically initiating and/or powering a pre-flight test sequence based on the detection of receipt of the wireless power at the aircraft, such as wireless power received by the controller as signals Vin 175, 176 and 177.

Consequently, although it is noted that aircraft 101 may include a battery to power aircraft systems 102, some embodiments described herein may use a combination of receiver 163, regulator 161 and/or controller 160 to automatically initiate, perform and power a test sequence to determine statuses of systems of the aircraft, using power other than or in addition to power from the battery. For example, one embodiment of a solution for initiating a test of aircraft 101 based on detection of wireless power, includes using voltage regulator 161 to detect receiving wireless power from a source; and controller 160 to initiate a test sequence to determine statuses of systems of aircraft 101, based on the detection of receipt of the wireless power. Also, one embodiment of a solution for powering a test of aircraft 101 based on received wireless power includes using receiver 163 to receive inductive wireless power; and controller 160 powered by the received inductive wireless power during performance (e.g., by controller 160) of an automatic test of systems of aircraft 101. Moreover, one embodiment of a solution of a process for initiating a test of aircraft 101 based on detection of wireless power includes automatically detecting received wireless power at aircraft 101, such as at regulator 161; and initiating a test sequence at the aircraft to determine statuses of systems of the aircraft in response to detecting the received wireless power at aircraft 101, such as by controller 160.

In other words, the aircraft battery may power controller 160, through regulator 161, prior to and/or during flight, when the receipt of wireless power is not detected by regulator 161. However, in some embodiments, instead of the aircraft battery, wireless power received by aircraft 101 may be used to power controller 160, through regulator 161, during an automatic wireless power initiated pre-flight test sequence of systems of the aircraft. The wireless power initiated pre-flight test may occur when the receipt of wireless power from a source or transmitter is detected by regulator 161, as will now be further described with respect to FIGS. 2-7.

Figure 2:
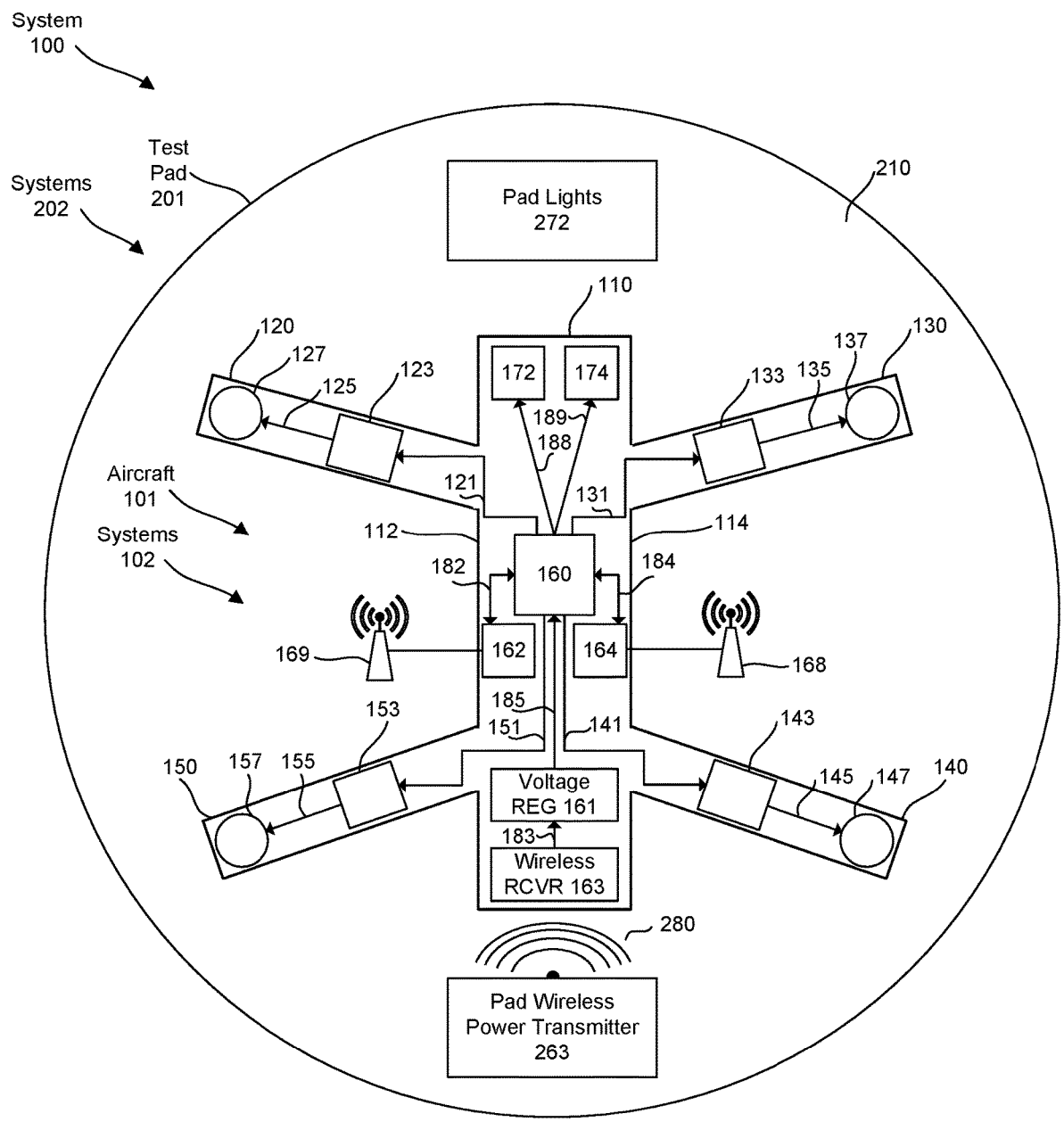
FIG. 2 is a block diagram of one embodiment of the system of FIG. 1, showing certain systems of the aircraft and additional systems of a test pad.

More specifically, while FIG. 1 shows aircraft systems 102 or aircraft components of system 100 used to initiate and/or power a test of aircraft 101 based on detection of wireless power at the aircraft, system 100 may also include test pad systems or components that cooperate with aircraft system 102. For example, FIG. 2 is a block diagram of one embodiment of wireless power initiated test system 100 for initiating a test of aircraft 101 based on detection of wireless power at the aircraft, showing aircraft systems 102 of aircraft 101 and test pad systems 202 of test pad 201. FIG. 2 shows pad 201 having the following pad systems 202: pad top surface 210, pad wireless power transmitter 263, and pad lights 272. Pad 201 may be described as a "drone verification pad." Aircraft systems 102 and pad systems 202 may include additional components and circuitry as will be discussed further below in FIGS. 3-4B.

Pad top surface 210 may be a top surface of the pad under or onto which systems 202 may be mounted or housed. Surface 210 may be made of or include plastic, rubber, wood, carbon fiber, fiberglass, aluminum, and/or other materials know to be part of such a test pad.

FIG. 2 also shows pad 201 including inductive wireless power transmitter 263 mounted on or in pad 201, which may be a wireless power transmitter configured to transmit inductive wireless power 280 to aircraft 101 or receiver 163. Transmitter 263 may be mounted onto or just under top surface 210, such as by glue or adhesive. Aircraft wireless receiver 163 may be configured to receive wireless power 280 from transmitter 263, such as when transmitter 263 is located below the aircraft. Receiver 163 may be configured to receive wireless power 280 from transmitter 263 when it is within 3 feet of the transmitter. In one embodiment, the power will be received when transmitter 263 is within ½ foot of the receiver.

Pad 201 may also include pad lights 272 capable of illuminating with one or more colors. In some case, they are light emitting diode (LED) lights mounted through or on surface 210. They may be one or more segments or rows of between 5 and 15 LEDs that all illuminate or blink with the same color at the same time.

Referring now to FIGS. 1-2, system 100 may use regulator 161 that is configured to detect receiving wireless power 280 from a source or transmitter 263; and controller 160 that is configured to initiate a test sequence to determine statuses of systems 102 of the aircraft, based on the detection of receipt of the wireless power 280. The test sequence may be a pre-flight test sequence that system 100 automatically initiates based on the detection of receipt of wireless power 280 during or after initialization of the aircraft's electrical systems 102, such as after initialization of aircraft controller 160. Controller 160 may be powered during conducting of the test sequence by the wireless power 280 received by the voltage regulator 161 or receiver 163.

Figure 3:
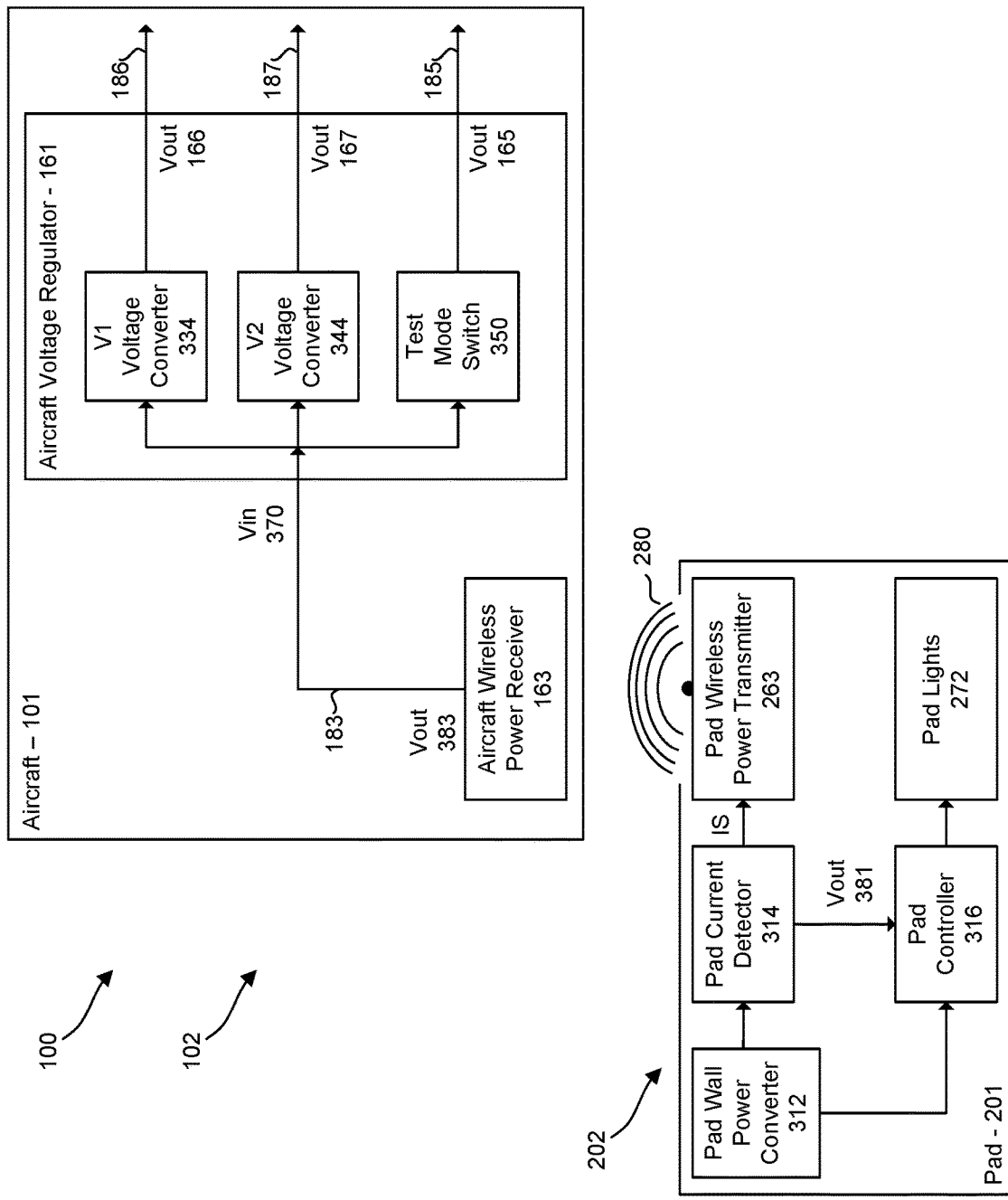
FIG. 3 is a block diagram of one embodiment of the system of FIG. 1, showing additional components or circuits within the aircraft and test pad.

To accomplish these tasks, system 100 may include additional components or circuits within pad 201 and regulator 161 that cooperate together. For example, FIG. 3 is a block diagram of one embodiment of system 100, showing additional components or circuits within pad 201 and/or regulator 161 that cooperate to initiate a test of aircraft 101 based on detection of wireless power at the aircraft. The components or systems of FIG. 3 may be electrical circuits. In some cases, FIG. 3 shows some of the electrical circuits of aircraft systems 102 and pad systems 202 of FIG. 2.

FIG. 3 shows pad systems 202 of pad 201 having pad wall power converter 312 electrically connected to pad current detector 314 and pad controller 316. Detector 314 is electrically connected to pad controller 316 and to pad wireless transmitter 263. Systems 202 are also shown having pad lights 272 electrically connected to controller 316. Transmitter 263 is outputting wireless inductive power 280.

Pad wall power converter 312 may have a power input electrically connected to a source of power such as a wall outlet or other power source sufficient to power pad systems 202. It may convert the power from this source to power that powers controller 316, lights 272 (connection not shown), and transmitter 263 via current detector 314.

Pad current detector 314 which is outputting voltage output Vout 381 through an electrical connection to pad controller 316; and outputting electrical current output IS through the electrical connection to pad wireless transmitter 263.

Figure 4A:
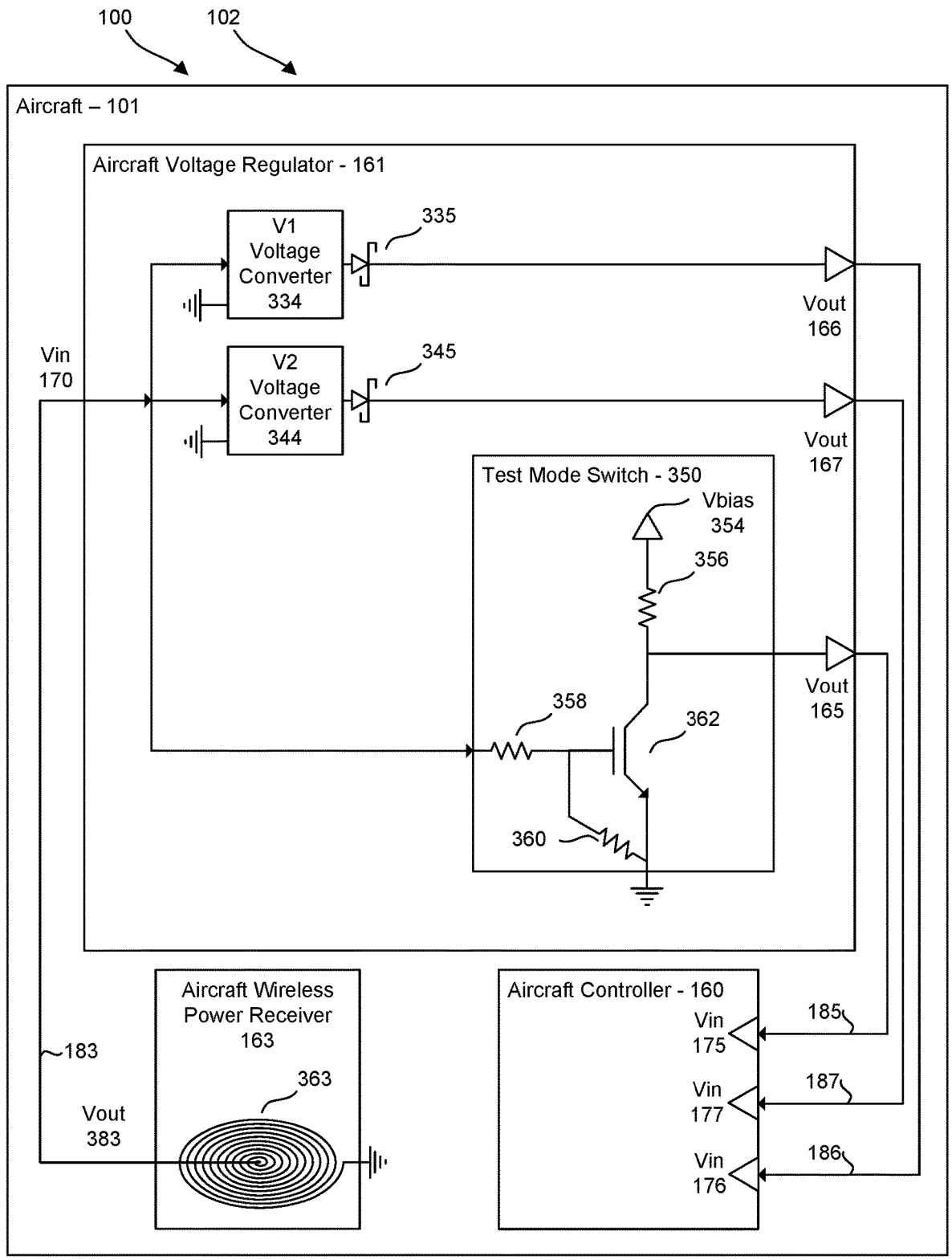
FIG. 4A is an electronic schematic diagram of one embodiment of certain components of the system of FIG. 1, showing more detail of circuits within the aircraft.
Figure 4B:
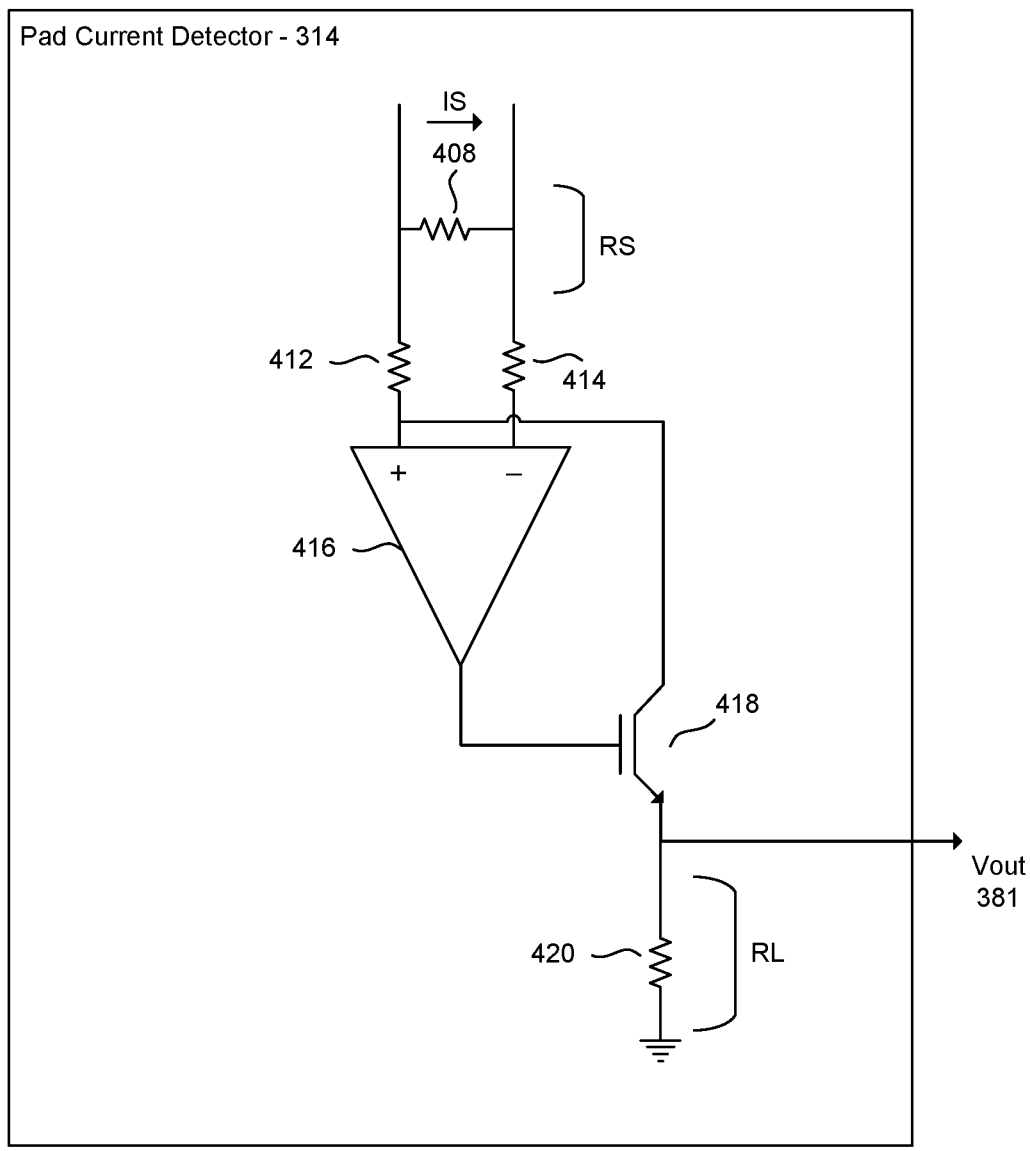
FIG. 4B is an electronic schematic diagram of one embodiment of certain components of the system of FIG. 1, showing more detail of circuits within the test pad.

Controller 316 may detect an amount of wireless power transmitted by transmitter 263 such as by receiving or detecting Vout 381 from detector 314, where Vout 381 is based on current IS (see FIG. 4B for more details). Controller 316 may control lights 272, such as by blinking certain color lights based on the amount of wireless power transmitted by transmitter 263 as detected in Vout 381.

As previously noted, receiver 163 may receive inductive wireless power 280 from transmitter 263, and convert the wireless power to a power output signal Vout 383 that is output on connection 183 to an input Vin 170 of regulator 161. The power output signal may have an output voltage range Vout 383 and an output current range that depends on the amount of power of the wireless power 280 received by the receiver.

FIG. 3 shows aircraft systems 102 of aircraft 101 having receiver 163 output power or voltage Vout 383 through electrical connection 138 to input power or voltage Vin 370 of regulator 161. Vin 370 is shown as an input to V1 voltage converter 334, V2 voltage converter 344, and test mode switch 350.

V1 voltage converter 334 may convert voltage Vin 370, to a different voltage that it outputs as voltage Vout 166 on electrical connection 186 to Vin 176 of controller 160. V2 voltage converter 344 may or may not convert voltage Vin 370, to a different voltage that it outputs as voltage Vout 167 on electrical connection 187 to Vin 177 of controller 160.

Test mode switch 350 may output different voltages as voltage Vout 165 on electrical connection 185 to Vin 175 of controller 160 depending on the value of Vin 370. In one example, when Vin 370 is below a threshold amount of volts, switch 350 may output a certain voltage at Vout 165 that indicates that it is not detecting receiving wireless power at aircraft 101 from a source. If Vin 370 increases to above the threshold amount of volts, switch 350 may switch the output voltage at Vout 165 to a different voltage to indicate that it is detecting receiving wireless power at aircraft 101 from a source. It can be appreciated that if Vin 370 then decreases below the threshold, switch 350 may again output the certain voltage at Vout 165.

Consequently, referring to FIGS. 1-3, system 100 may use regulator 161 that is configured to detect a power signature of wireless power 280 from a source or transmitter 263; and switch 350 of regulator 161 that is configured to detect an amount of power of received wireless power 280 by detecting an amount of voltage in the Vin 370 signal. For example, regulator 161 may be configured to monitor the output of receiver 163 to determine if receiver 163 has received wireless power 280. Regulator 161 may then switch on the aircraft controller 160 using signal Vout 165, based on receiver 163 detecting that the power signature of the received wireless power 280 matches a power signature of the wireless power receiver, and regulator 161 detecting that the amount of power of the received wireless power exceeds a threshold amount of power (e.g., based on voltage in the Vin 370 signal), such as needed to power the aircraft controller 160 during the test sequence.

To accomplish these tasks, aircraft system 102 may include additional components or circuits within receiver 163 and regulator 161 that cooperate together. For example, FIG. 4A is an electronic schematic diagram of one embodiment of certain components of system 100, such as showing more detail of circuits within receiver 163 and regulator 161 that cooperate to initiate a test of aircraft 101 based on detection of wireless power at the aircraft. The components or systems of FIG. 4A may be electrical circuits. FIG. 4A shows more details of the electrical circuits of receiver 163, regulator 161 and controller 160 of FIG. 3.

FIG. 4A shows receiver 163 having inductor coil 363 having one end grounded and the other end outputting output voltage Vout 383 through electrical connection 138 to input power or voltage Vin 370 of V1 voltage converter 334, V2 voltage converter 344, and test mode switch 350. Vout 383 may be based on an amount of wireless inductive power received or incident upon coil 363.

In one case, the output voltage Vout 383 of receiver 163 is between 3 and 8 volts. In one embodiment the output voltage Vout 383 is 5 volts and the output current is 500 milliamps when receiver 163 is receiving 5 Watts of wireless power 280, such as when it is receiving wireless power that is 5 volts at 1000 milliamps being transmitted by transmitter 263. For example, the maximum output power of transmitter 263 may be around 5 Watts which may provide up to 1000 mA current at 5V to receiver 163 on the other side of the wireless connection. The transmitter may have a charging distance of 2-8 mm, or greater in some cases, but that works with receiver 161 when aircraft 101 is located on pad 201.

In one embodiment, transmitter 263 and receiver 163 may be a wireless thin and smart inductive charging receiver and transmitter, such as built to a "Qi" (the Chinese word for energy flow) standard. They may be capable of a wireless energy transfer of up to 5 Watts, and usable for wireless charging of battery operated devices like cell phones, portable music players and cameras.

For example, each of coil 363 and transmitter 263 may have numerous receiver inductor coils, such as between 10 and 100 conductive wire coils. The coils may have a circular, square, rectangular, oval or other inductive coil shape. They may be arranged in a plane such as with the radius or perimeter of the coils being smaller in the center and expanding to larger radius or perimeter coils on the outside edge.

In some embodiments, receiver 163 may be configured to detect that a power signature of the received wireless power 280 matches a power signature of the wireless power receiver by detecting that power 280 matches wireless power that is receivable by inductor coil 363. In some cases, such a power signature may include or be based on whether the wireless power is inductive or radiative (e.g., power beaming); whether the wireless power is near field or far field; and/or the transmission frequency of the wireless power. For example, coil 363 may be configured to detect that a received frequency range of near field, inductively transmitted wireless power 280 from transmitter 263 matches a frequency range for near field, inductively transmitted wireless power that receiver 163 or coil 363 is capable of receiving. In some cases, detecting the match is inherently based on the structure of coil 363, and is indicated by the existence of enough power being output on electrical connection 183 by receiver 163 to switch tests mode switch 350. In one case, the existence of enough power is shown by Vout 383 being above a certain voltage threshold, such as 5 volts; thus causing the output of switch 350 to switch to 0 volts as will be further discussed.

In more detail, FIG. 4A shows V1 voltage converter 334 having a connection to ground, input voltage Vin 370 and output Schottky diode 335. Converter 334 also includes internal circuitry (not shown) to convert a voltage level of Vin 170 to a higher voltage level of Vout 166. In one example, when Vin 370 is 5 volts, converter 334 is a step up voltage converter that outputs Vout 166 of 12 volts. When Vin 370 is 0 volts, Vout 166 may be 0 volts.

V2 voltage converter 344 is shown having a connection to ground, input voltage Vin 370 and output Schottky diode 345. Converter 344 may not include internal circuitry to convert a voltage level of Vin 170 to a different voltage level of Vout 166. In one example, when Vin 370 is 5 volts, converter 344 outputs Vout 167 of 5 volts. When Vin 370 is 0 volts, Vout 167 may be 0 volts.

Schottky diodes 335 and 345 (also known as hot carrier diodes) may be semiconductor diodes formed by the junction of a semiconductor with a metal. When sufficient forward voltage is applied to them, a current flows in the forward direction, which is shown by the arrow tip in FIG. 4A. They may have a relatively low reverse voltage rating, which may be well above what is expected in their application within regulator 161. They may have a low forward voltage drop (e.g., 150-450 millivolts), very fast switching speeds and better system efficiency, such as lower levels of power loss compared to ordinary PN junction diodes.

It can be appreciated that Vout 166 and/or Vout 167 may be used to power certain ones of aircraft systems 102, including controller 160, during initiating and conducting a test sequence to determine statuses of systems 102 due to receipt of wireless power 280, such detected by regulator 161.

Test mode switch 350 is shown having input voltage Vin 370 connected to a one end of resistor 358; and the other end of resistor 358 connected to a gate of transistor 362 and a first end of resistor 360. Switch is shown having voltage bias Vbias 354 connected to one end of resistor 356 and the other end of resistor 356 connected to voltage output Vout 165 and to the source or bias input of transistor 362. The drain or output of transistor 362 and other end of resistor 360 are connected to ground. Switch 350 may output at Vout 165: (1) the voltage level of Vbias 354 when between 0 volts and a threshold voltage is received at Vin 170, and (2) the voltage level of 0 volts when greater than the threshold voltage is received at Vin 170.

This threshold voltage may be based on Vin 170 being able to provide a sufficient amount of wireless power to power controller 160 during the test sequence to determine statuses of systems of the aircraft. In some case, the threshold is set so that when Vin 170 is above the threshold, controller 160 is able to power itself to perform the test sequence using the wireless power received by the controller at Vin 176 and/or Vin 177.

In one example, the value of the resistors may be as follows: resistor 356=10 k Ohms, resistor 358=10 k Ohm, and resistor 360=10 k Ohm. In this example, when Vin 370 is 5 volts, switch 350 may detect receiving wireless power at aircraft 101 from a source, and output 0 volts as voltage Vout 165. When Vin 370 is 0 volts, switch 350 may detect not receiving wireless power from a source, and output 3.3 volts (e.g., Vbias 354) or another non-0 voltage as voltage Vout 165.

In some embodiments, transistor 362 may be a type of field-effect transistor (FET) such as a metal-oxide-semiconductor field-effect transistor (MOSFET). It may have an insulated gate, whose voltage Vin 170 determines the conductivity of transistor 362 in the direction of the arrow, from the other end of resistor 356 to ground and the other end of resistor 360. This ability to change conductivity with the amount of applied voltage Vin 170 can be used by switch 350 to detect receiving wireless power from a source, and to switch on controller 160 by outputting an electronic signal to ground that causes Vout 165 to be 0 volts instead of Vbias 354 on connection 185 to Vin 175 of controller 160. Regulator 161 outputting electronic signal Vout 165 with 0 volts may be described as voltage regulator 161 being configured to detect (and detecting) receiving wireless power 280 from a source.

Figure 7:
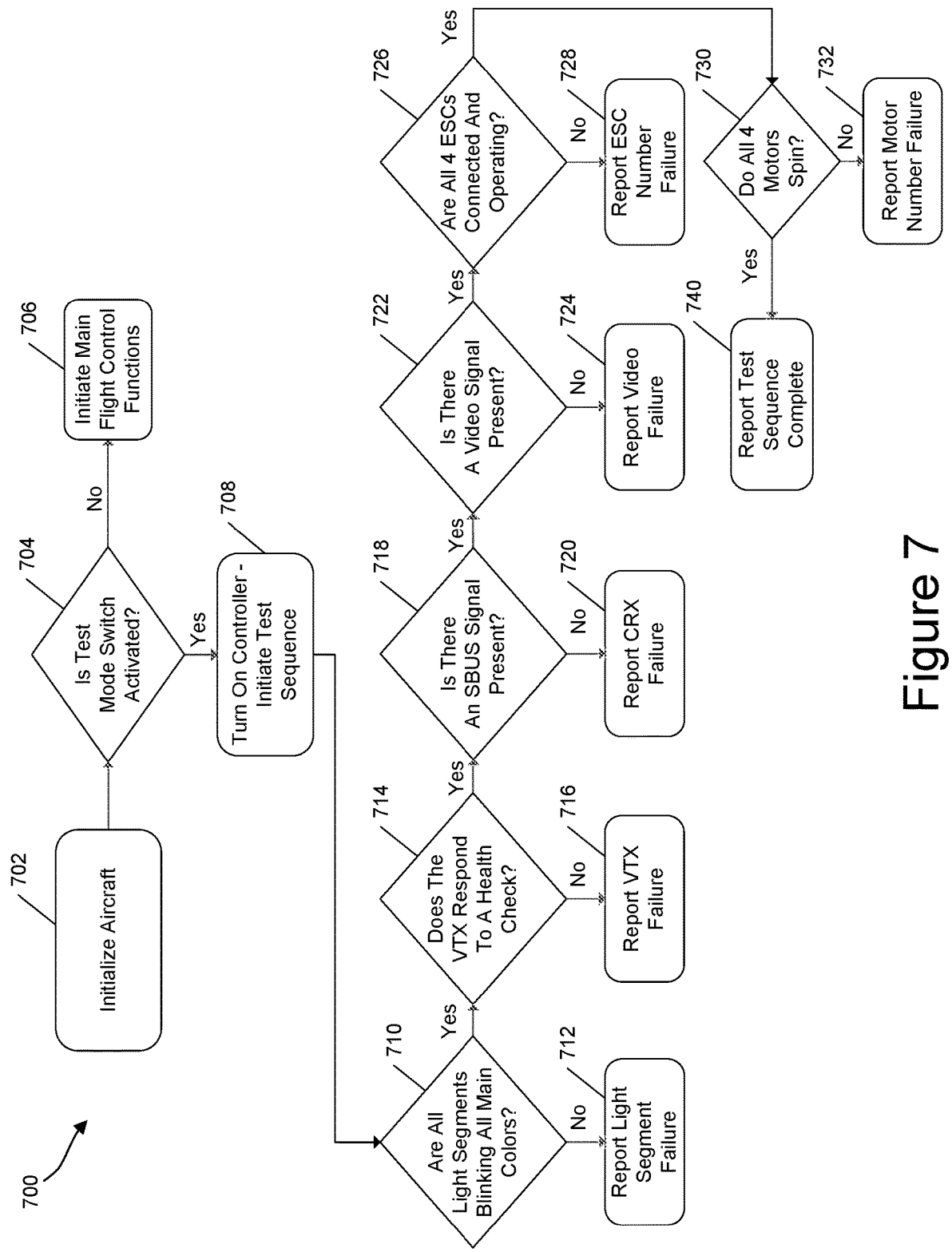
FIG. 7 is a flow chart describing one embodiment of a process for automatically initiating, performing and powering a test of an aircraft based on detected wireless power at the aircraft.

When controller 160 receives the voltage level of 0 volts at Vin 175 it may determine that aircraft 101 is receiving wireless power, turn on controller 160 and may automatically initiate a test sequence to determine statuses of systems of the aircraft (e.g., see step 708 of FIG. 7). In some cases, when controller 160 receives the voltage level of 0 volts at Vin 175, it may also power itself using the wireless power received by the controller at Vin 176 and/or Vin 177, during conducting of the test sequence. In some cases, it may also not connect to, disconnect from, or not use a battery of the aircraft for powering controller 160 during conducting of the test sequence by the wireless power received by the voltage regulator. In some cases, controller 160 receiving the voltage level Vin 175 of 0 volts may also be based on receiver 163 detecting that the power signature of the received wireless power 280 matches a power signature of the wireless power receiver as described herein. Controller 160 receiving signal Vin 175 with 0 volts may be described as controller 160 being configured to initiate (and initiating) a test sequence to determine statuses of systems 102 of the aircraft based on the detection of receipt of the wireless power (e.g., at regulator 161, such as based on the output of receiver 163).

When controller 160 receives the voltage level of Vbias 354 it may determine that aircraft 101 is not receiving wireless power and may automatically connect to or switch to being powered by a battery of the aircraft (not shown), such as to initiate main flight control functions (e.g., see step 706 of FIG. 7). In some cases, controller 160 receiving the voltage level of Vbias 354 may be based on receiver 163 not detecting that the power signature of the received wireless power 280 matches a power signature of the wireless power receiver as described herein.

In order to ensure that aircraft systems 102 are receiving enough wireless power and are able to test the aircraft systems, pad systems 202 may include additional components or circuits within pad current detector 314 that cooperate together. For example, FIG. 4B is an electronic schematic diagram of one embodiment of certain components of system 100, such as showing more detail of circuits within pad current detector 314 that cooperate with pad controller 316 and transmitter 263 to initiate a test of aircraft 101 based on detection of wireless power at the aircraft. The components or systems of FIG. 4B may be electrical circuits. For example, FIG. 4B is an electronic schematic diagram of one embodiment of pad current detector 314 shown in FIG. 3.

Pad current detector 314 may be used to detect the amount of power or current IS flowing into pad wireless power transmitter 263, and report that amount to pad controller 316 using Vout 381. This amount may indicate how much wireless power 280 is being used or consumed by aircraft systems 102. For example, current IS may flow across a resistor located between the differential inputs of an operational amplifier that has its output tied to the gate of a transistor. The source of the transistor may be tied to the positive input of the operational amplifier, and the drain of the transistor may be connected to a resistor. The voltage across this resistor may indicate the amount of wireless power transmitted.

In some cases, detector 314 may output a voltage at Vout 381 that is directly proportional to the amount of electrical current in current IS. For example, in FIG. 4A, sensor has electrical current IS flowing from one to the other end of resistor 408. Resistors 408 has resistance RS between its two ends. One end of resistor 408 is connected to a first end of resistor 412, and the other end of resistor 408 is connected to a first end of resistor 414. The other ends of resistors 412 and 414 are connected to the positive input and negative input of amplifier 416, respectively.

The output of amplifier 416 may be based on an amount of current IS flowing from one to the other end of resistor 408, having resistance RS. Amplifier 416 may be an operational amplifier (often op-amp) that is a direct current-coupled high-gain electronic voltage amplifier with a differential input connected to the other ends of resistors 412 and 414, and a single-ended output connected to the gate of transistor 418. It may produce an output potential (relative to circuit ground) to the gate of transistor 418 that is hundreds of thousands of times larger than the potential difference between its differential input.

The output of amplifier 416 is tied to a gate of transistor 418. The other end of resistor 412 is also connected to the source or input of transistor 418. The drain or output of transistor 418 is connected to one end of resistor 420, and to voltage output Vout 381. The other end of resistor 420 is connected to ground. Resistors 420 has resistance RL between its two ends.

Transistor 418 may be a FET transistor as described for transistor 362. It may have an insulated gate, whose voltage which is the output of amplifier 416 determines the conductivity of transistor 418 in the direction of the arrow, from the other end of resistor 412 to one end of resistor 420. The change in conductivity with the amount of applied voltage from the output of amplifier 416 can be used by detector 314 to detect whether (e.g., ensure that) an amount of current IS flowing to transmitter 263 is greater than a minimum current threshold for powering aircraft controller 160, and/or is less than a maximum current threshold indicating damage to the systems of the aircraft (such as a short circuit to or in one of the systems to which Vout 383 of receiver 163 is electrically connected). This detection include sensor identifying a failure of the current to be in the range of these thresholds by outputting Vout 381 to be less than a certain minimum voltage when IS is less than the minimum current threshold and/or to be greater than a certain maximum voltage when IS is greater than the maximum current threshold. This outputting of electronic signal Vout 381 may be described detector 314 being configured to detect whether an amount of current IS flowing to transmitter 263 is greater than a minimum current threshold for powering controller 160, and/or is less than a maximum current threshold indicating damage to systems 102.

In some embodiments, when controller 316 receives output Vout 381 that is less than the certain minimum voltage, it sends signals to pad lights 272 causing them to indicate that current IS is less than the minimum current threshold to power controller 160, such as by causing the lights to blink with a certain color of illumination. In some embodiments, when controller 316 receives output Vout 381 that is greater than the certain maximum voltage, it sends different signals to pad lights 272 causing them to indicate that current IS is greater than the maximum current threshold indicating damage to systems 102, such as by causing the lights to blink with a different color of illumination.

In one embodiment, when controller 316 receives output Vout 381 that is less than the certain minimum voltage it may cause the test sequence to be discontinued such as by powering down transmitter 263 or pad 201. In some cases, when it receives output Vout 381 that is greater than the certain maximum voltage, aircraft 101 may be considered unfit to fly or perform.

In one example, the value of the resistors of detector 314 may be as follows: resistor 408=10 Ohms, resistor 412=1 k Ohm, resistor 414=1 k Ohm, and resistor 420=10 k Ohm. In this example, detector 314 may output a voltage at Vout 381 that is Vout 381=IS×RS×(RL/1 k Ohm).

In this example, when IS is between 3.5 milliamps and 35 milliamps, detector 314 may detect transmitter 263 transmitting wireless power 280 to aircraft 101 at between 2 and 10 Watts. In one case, it may detect transmitter 263 transmitting wireless power 280 at between 3 and 8 volts, with current between 500 and 1200 milliamps.

In one embodiment, the minimum current threshold of IS for powering controller 160 is 200 milliamps and the maximum current threshold of IS indicating damage to the systems 102 of the aircraft is 1500 milliamps. It can be appreciated that other values for the minimum and maximum thresholds can be used or determined such as based one the circuitry of controller 160 and/or other systems of aircraft systems 102.

In some cases, as described, receiver 163 and the source/transmitter 263 may be a near field or non-radiative power wireless power receiver and transmitter. In other cases, receiver 163 and the source/transmitter 263 may be another type of wireless power receiver and transmitter. In one other case they maybe a far field or radiative (e.g., power beaming) wireless power receiver and transmitter.

As discussed, system 100 may be useful for automatically initiating and/or powering a pre-flight test sequence at aircraft controller 160 based on the detection of receipt of the wireless power at aircraft 101. Processes for performing automatic initiating of the test sequence and/or automatic powering of the controller to perform the test sequence, such as using system 100, are discussed in more detail below with respect to the flow charts of FIGS. 5A-7. In some cases, processes of FIGS. 5A-7 are processes for a wireless power initiated aircraft pre-flight test system for testing an unmanned aircraft or drone that is to be in a race.

Figure 5A:
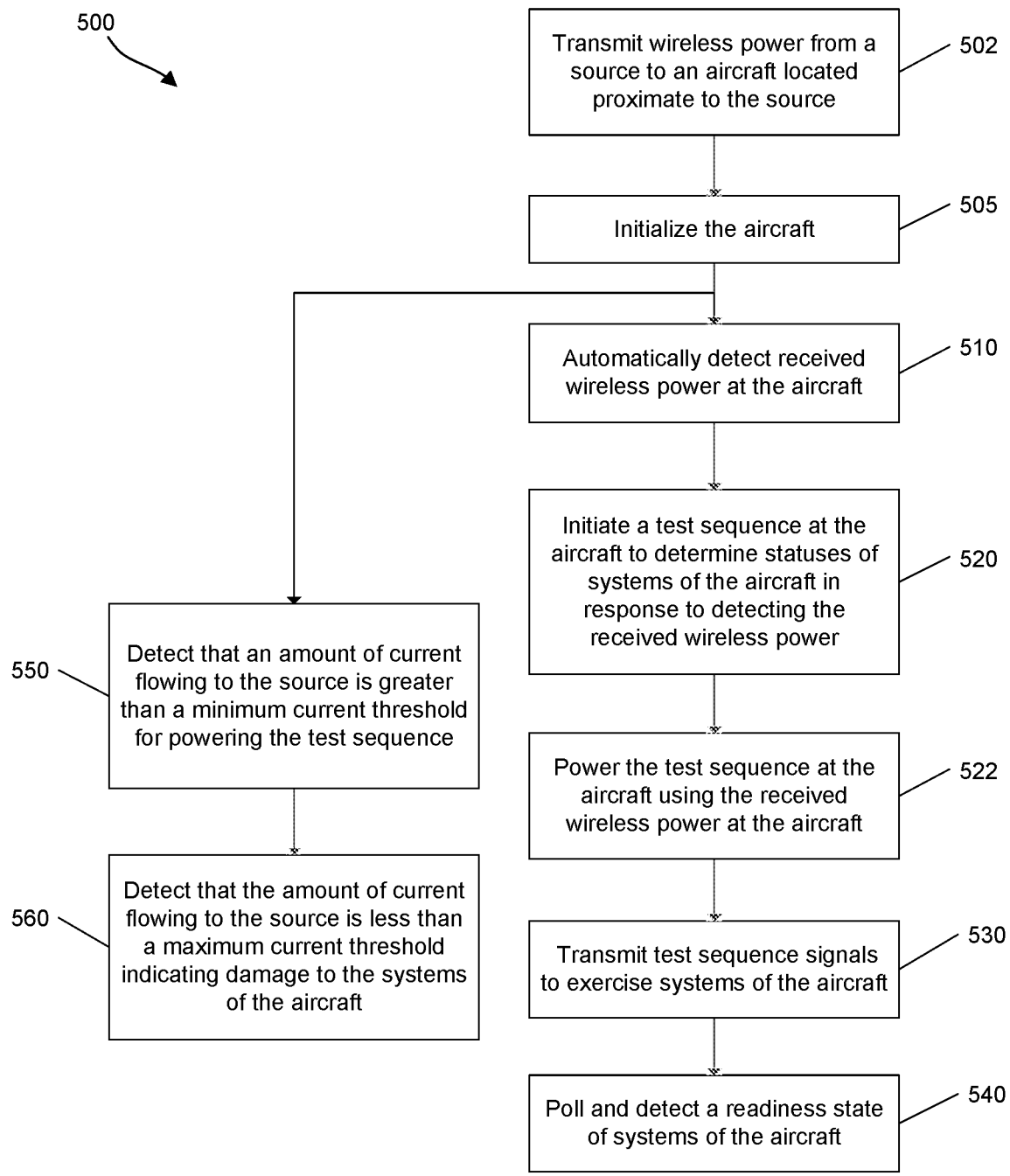
FIG. 5A is a flow chart describing one embodiment of a process for initiating a test of an aircraft based on detection of wireless power at the aircraft.
Figure 5B:
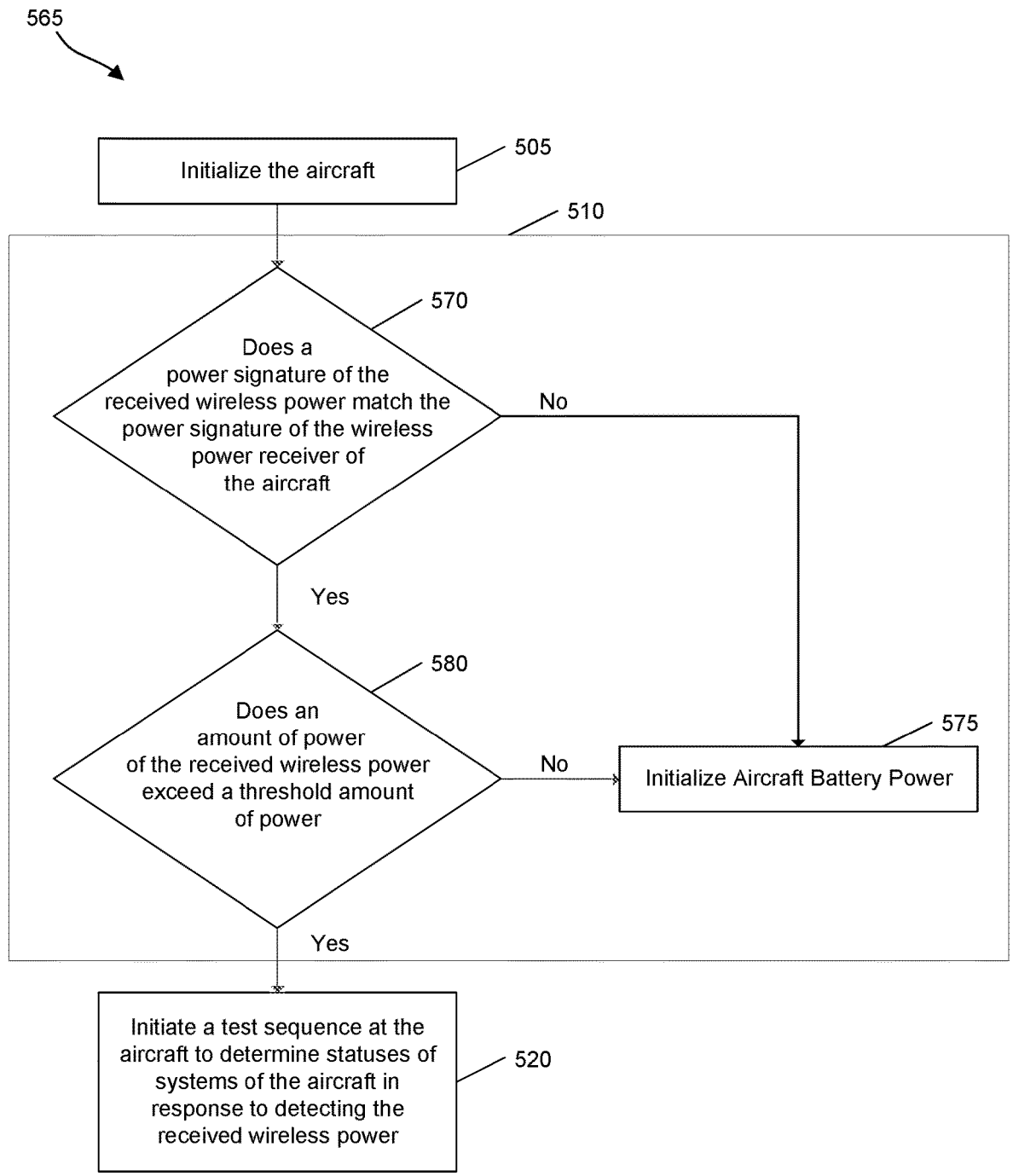
FIG. 5B is a flow chart describing one embodiment of a process for automatically detecting received wireless power at an aircraft.
Figure 6:
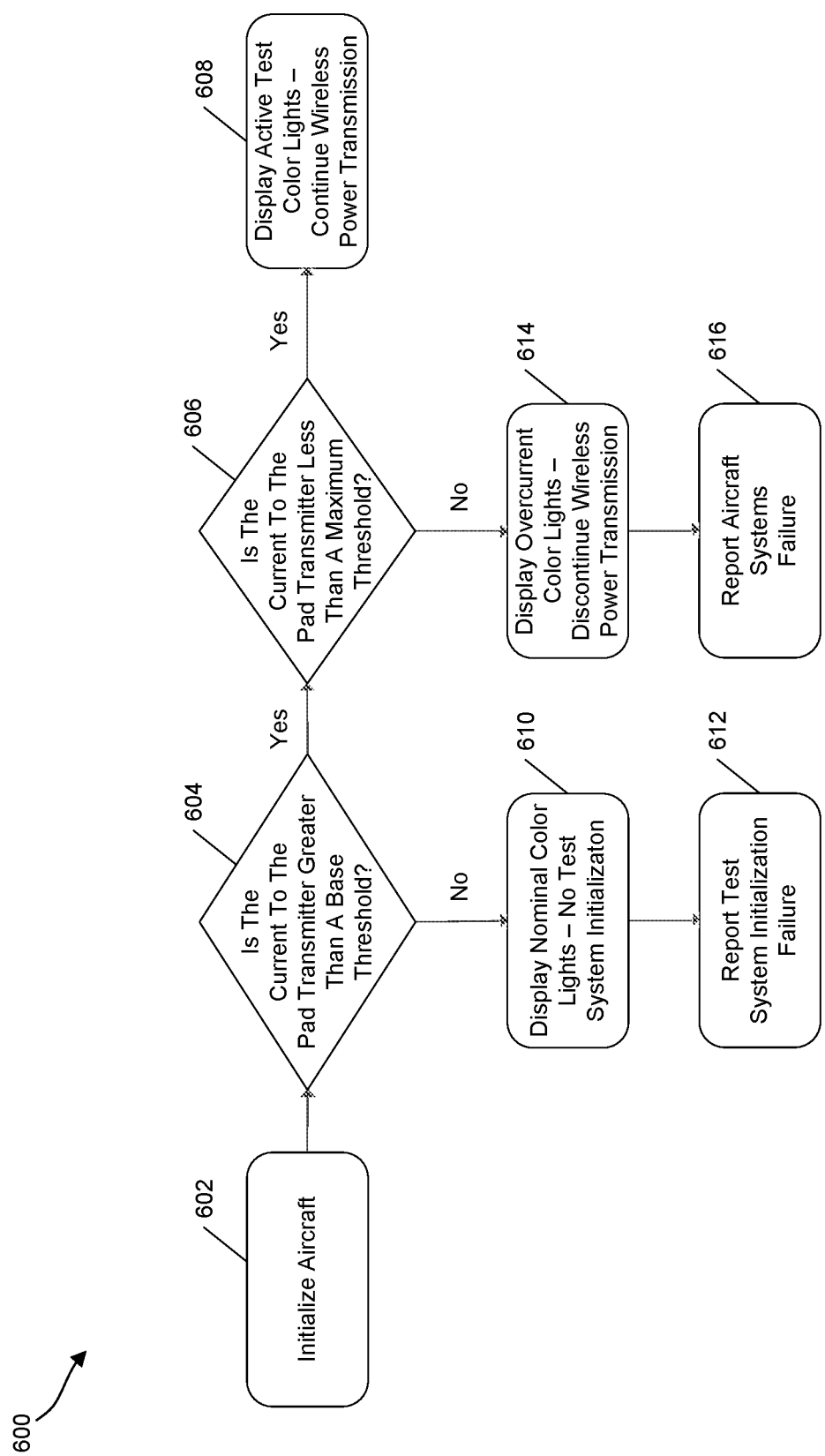
FIG. 6 is a flow chart describing one embodiment of a process for detecting whether an amount of transmitted wireless power is between a threshold for wireless power initiating a test of an aircraft and for detecting damage to systems that perform that test.

For example, FIG. 5A is a flow chart describing one embodiment of process 500 for initiating a test of aircraft 101 based on detection of wireless power at the aircraft. In some cases, process 500 may power aircraft controller 160 to perform the test sequence using the received wireless power. In one embodiment, process 500 is performed by aircraft systems 102, and optionally includes performance by test pad systems 202. FIG. 5B will provide a more detailed example of step 510 of process 500; FIG. 6 will provide a more detailed example of steps 505 and 550-560 of process 500; and FIG. 7 will provide a more detailed example of steps 505-540 of process 500.

Process 500 starts with step 502, where wireless power 280 is transmitted from a source, or wireless pad transmitter 263, to aircraft 101 located proximate to the source. In some embodiments, step 502 may also include powering down the aircraft's electrical systems, such as the aircraft controller 160, prior to transmitting the wireless power from the source. In some cases, at step 502, the source may begin transmitting the wireless power 280, and aircraft 101 may be located proximate to the source, such as by being put onto or above the test pad 201, such as described herein. In other cases, at step 502, the source may begin transmitting the wireless power 280, but the aircraft 101 is not yet located proximate to the source, such as noted at step 505.

In some instances, initiating the transmission of wireless power at step 502 may be performed by a test operator manually plugging in a power cord of the pad, flipping a switch of the pad, activating a computer control of the pad, and/or connecting a cable/connector between components of the pad. In some instances, a test operator manually places or locates the aircraft proximate to the source at step 502.

Next, at step 505, aircraft 101 is initialized. Here, the aircraft's electrical systems, such as the aircraft controller 160, may then be initialized. In some cases, this includes powering on systems 102 using a battery of the aircraft and/or wireless power, such as described herein. Here, aircraft 101 may be initialized by aircraft battery power before or after being located proximate to the source as noted at step 502. In some instances, initializing the aircraft at step 505 may include a test operator manually placing or locating the aircraft proximate to the source of wireless power or pad 201.

Next, at step 510, received wireless power 280 is automatically detected at aircraft 101. Here, power 280 may be detected using receiver 163, regulator 161, switch 350 and/or controller 160, as described herein. In some embodiments, step 510 includes step 505, such as where the aircraft begins receiving wireless power 280 prior to being powered by or initialized by power from the aircraft battery. In this case, systems 102 may be initialized by and/or powered by power 280. In this case, systems 102 may also be powered by battery power, after initialization, such as by also connecting them to, switching them to or powering them with the battery.

Step 510 may include using receiver 163 to detect a power signature of the received wireless power and detecting an amount of power of the received wireless power; and using regulator 161 to initiate a test sequence by switching on controller 160 to conduct the test sequence as described for step 520, based on detecting that the power signature of the received wireless power matches a power signature of the detector, and that the amount of power of the received wireless power exceeds a threshold amount of power (e.g., see switch 350) at step 510, such as described herein. Embodiments of steps 510 and 520 are further described at FIG. 5B. In some instances, detecting received wireless power at aircraft 101 at step 510 is "automatically" performed by aircraft systems 102 or regulator 161, such as without the assistance of a test operator.

Next, at step 520, a test sequence is automatically initiated at aircraft 101 to determine statuses of systems of the aircraft in response to detecting the received wireless power at step 510. Here, the test sequence may be automatically initiated by controller 160 to determine the status of aircraft systems 102 based on the detection of receipt of the wireless power, as described herein. Step 520 may include using regulator 161 to initiate a test sequence by switching on controller 160 to conduct the test sequence, as discussed at step 510. In some instances, initiating the test sequence at step 520 is "automatically" performed by aircraft systems 102 or controller 160, such as without the assistance of a test operator.

At step 522, controller 160 is powered during conducting of the test sequence by the wireless power 280 received at aircraft 101, such as by voltage regulator 161. Here, the test sequence may be automatically powered at controller 160 using the inductive wireless power received at receiver 163, as described herein. For example, step 522 may include controller 160 configured to be powered by the received inductive wireless power provided at Vin 176 and/or Vin 178 during performing of an automatic test of systems of the aircraft.

In some instances, step 522 includes controller 160 not connecting to, disconnecting from, or not using a battery of the aircraft for powering controller 160 during conducting of the test sequence. In some instances, powering controller 160 and/or the test sequence at step 522 is "automatically" performed by aircraft systems 102 or controller 160, such as without the assistance of a test operator.

At step 530, test sequence signals are transmitted to exercise systems of aircraft 101. This sequence of signals may be used to assure the airworthiness of aircraft 101 for takeoff and flight by inspecting or testing the aircraft's electrical system, propulsion systems, communication systems, flight control systems, and power systems. In some cases, step 530 may include controller 160 transmitting test sequence signals to other systems 102 to exercise those systems. Here, the test sequence signals may be automatically transmitted by controller 160 based on and after automatic initiation of the test sequence, as described herein, such as in FIG. 7. For example, step 530 may include controller 160 configured to transmit test sequence signals to test the proper functionality of various systems 102 including: lights 172; video camera 174; video data transmitter 162; control signal receiver 164; electronic speed controllers (ESCs) 123, 133, 143 and 153; and propulsion sources 127, 137, 147 and 157. In some cases, controller 160 transmits lighting control signals to lights 172 to test the proper functionality of lights 172; detects whether a video signal is received from video camera 174 to test the proper functionality of video camera 174; transmits a health check signal to video data transmitter 162 to test the proper functionality of video data transmitter 162; detects whether a system bus signal is received from control signal receiver 164 to test the proper functionality control signal receiver 164; transmits motor control signals to ESCs 123, 133, 143 and 153 to test the proper functionality of those ESCs; and transmits propulsion driver signals (e.g., via the ESCs) to propulsion sources 127, 137, 147 and 157 to test the proper functionality of those propulsion sources. In one embodiment, the controller transmits the test sequence signals to test all of these systems. In addition to transmitting the test sequence signals, step 522 may include controller 160 sending signals to or causing Vout 166, Vout 167, and/or battery power signals to be sent to the systems, such as the ESCs and/or propulsion sources. In some instances, controller 160 transmits test sequence signals at step 530 "automatically", such as without the assistance of a test operator.

At step 540, the systems of aircraft 101 being tested are polled to detect a readiness state of those systems. This may include controller 160 polling the systems 102 to which is has sent the test sequence signals in step 530, and receiving a response electrical signal from those systems indicating the readiness state of those systems. The response signal may indicate the readiness state by identifying those systems as being ready for flight operations or not being ready for flight operations, such as based on whether they are functioning properly or send an expected response signal. Here, these systems may be automatically polled by controller 160 based on and after sending the test sequence signals, as described herein, such as in FIG. 7. For example, step 540 may include controller 160 configured to poll to detect a readiness state of various systems 102 including: lights 172; video camera 174; video data transmitter 162; control signal receiver 164; electronic speed controllers (ESCs) 123, 133, 143 and 153; and propulsion sources 127, 137, 147 and 157. In one embodiment, the controller polls to determine a readiness state of all of these systems. In one embodiment, the determining the readiness state of these systems includes confirming that they are functioning proper or as expected in response to receiving the test sequence signals transmitted in step 530. If any of these systems do not have their readiness state confirmed, such as by failing to function properly or as expected at step 540, aircraft 101 may be considered unfit to fly or perform.

In some instances, controller 160 polls to determine the readiness state of systems 102 at step 540 "automatically", such as without the assistance of a test operator. In other cases, in addition to controller 160 automatically polling to determine the readiness state of certain ones of systems 102, step 522 includes a test operator manual "polling" or visually inspecting other ones of systems 102 to determine their readiness state, such as of lights 172, the ESCs and/or the propulsion sources, such as described in FIG. 7.

In some cases, steps 530-540 occur after automated initiation of the test sequence at step 520, while aircraft controller 160 is being powered by the wireless power received at step 522.

After step 505, process 500 also continues to step 550 at which it is automatically detected that an amount of current flowing to the wireless power source or transmitter 263 is greater than a minimum current threshold for powering controller 160 to perform the test sequence. Here, pad detector 314 may automatically detect that an amount of current IS flowing to transmitter 263 is greater than a minimum current threshold for using wireless power 280 to power controller 160, as described herein. If the amount of current is not greater than the minimum current threshold, a failure of the test system initialization may be reported to a test operator, such as by pad controller 316 as described for FIG. 6. In some instances, detecting that the amount of current is greater than the minimum current threshold at step 550 is "automatically" performed by pad detector 314 and pad controller 316, such as without the assistance of a test operator.

At step 560 it is automatically detected that an amount of current flowing to the wireless power source or transmitter 263 is less than a maximum current threshold indicating damage to systems 102 of the aircraft. Here, pad detector 314 may automatically detect that an amount of current IS flowing to transmitter 263 is less than a maximum current threshold indicating that the amount of wireless power 280 used by the aircraft is the result of a wiring problem, short circuit or other damage to systems 102 of the aircraft, as described herein. If the amount of current is not less than the maximum current threshold, a failure of systems 102 may be reported to a test operator, such as by pad controller 316 as described for FIG. 6. In some instances, detecting that the amount of current is less than the maximum current threshold at step 560 is "automatically" performed by pad detector 314 and pad controller 316, such as without the assistance of a test operator.

In some cases, process 500 only includes steps described as being performed by aircraft systems 102. In some embodiments of process 500 may only include steps 510 and 520. In some cases of process 500, steps 502 and 505 are optional. For some embodiments of process 500, steps 550 and 560 are optional. In these cases, process 500 may be focused on the actions performed by aircraft 101.

In other cases, process 500 only includes steps described as being performed by pad systems 202. In one example, process 500 only includes steps 550 and 560.

As noted above, embodiments of steps 510 and 520 will now be further described at FIG. 5B. For example, FIG. 5B is a flow chart describing one embodiment of process 565 for automatically detecting received wireless power 280 at aircraft 101. In some cases, process 565 is performed by aircraft systems 102.

Process 565 starts with step 505 as described for process 500. After step 505, process 565 continues to step 510 which is broken up into more detail at steps 570 and 580.

At step 570, received wireless power 280 is automatically detected at aircraft 101 including by determining if a power signature of power 280 matches a power signature of receiver 163. Here, receiver 163 may automatically detect a power signature of the received wireless power 280 and automatically determine whether that power signature matches a power signature of receiver 163, as described herein. In some cases, step 570 includes coil 363 configured to determine that a received frequency range of near field, inductively transmitted wireless power 280 matches a frequency range for near field, inductively transmitted wireless power that the coil and receiver 163 is capable of receiving.

If the signatures do not match at step 570, process 565 continues to step 575 where aircraft battery power is maintained or initialized. This may include automatically maintaining or switching to aircraft systems 102 being powered by a battery of the aircraft (not shown), such as to initiate main flight control functions (e.g., see step 706 of FIG. 7). It may also include connecting to, switching to, or using a battery of the aircraft for powering controller 160 as described herein, such as at steps 505 and/or 510.

If the signatures do match at step 570, process 565 continues to step 580 where received wireless power 280 is also automatically detected at aircraft 101 including by determining if an amount of power 280 exceeds a threshold amount of power. Here, regulator 161 may automatically detect an amount of power of the received wireless power 280 and automatically determine whether output voltage Vout 383 of the wireless power exceeds a threshold voltage for powering controller 160, as described herein. In some cases, step 580 includes switch 350 configured to determine that voltage Vin 370 received from receiver 163 exceeds the threshold voltage, and outputting an On signal at voltage Vout 165 to a test mode power sentinel pin Vin 175 of controller 160 while the output voltage exceeds the threshold voltage, as described herein. If the output voltage does not exceed the threshold voltage, process 565 continues to step 575 where aircraft battery power is maintained or initialized.

If the output voltage does exceed the threshold voltage, process 565 continues to steps 520-540 of process 500, such as where regulator 161 initiates a test sequence by switching on controller 160 to conduct the test sequence as described above for step 520. In this case, step 520 may include controller 160 having input power sentinel pin Vin 175 configured to switch on the controller upon receipt of the On signal from output Vout 165 of the test mode switch circuit 350.

In some instances, steps 570-580 are "automatically" performed by aircraft systems 102, such as without the assistance of a test operator.

In some cases, process 565 only includes steps described as being performed by aircraft systems 102. In some embodiments, process 565 may only include steps 570, 580 and 520. In some cases of process 565, step 505 is optional. For some embodiments of process 565, step 575 is optional. In these cases, process 565 may be focused on the actions performed by aircraft 101.

As noted above, embodiments of steps 505 and 550-560 of process 500 will now be further described at FIG. 6. For example, FIG. 6 is a flow chart describing one embodiment of process 600 for automatically detecting at pad 201 whether an amount of wireless power 280 is between a minimum and a maximum current threshold for initiating a test of aircraft 101 based on detection of wireless power at the aircraft. In one instance, process 600 may be a process for detecting whether an amount of current of transmitted wireless power 280 is between a minimum current threshold for wireless power initiating a test of an aircraft based on detection of wireless power at the aircraft and a maximum current threshold for detecting damage to systems 102 that perform that test. Some embodiments of process 600 detect whether amount of current IS flowing to transmitter 263 is greater than a minimum and/or less than a maximum current threshold for powering controller 160 during a wireless power initiated test sequence at the aircraft. In some cases, process 600 is performed by pad systems 202, based on an amount of power 280 consumed by aircraft systems 102.

Process 600 starts with step 602 where aircraft 101 is initialized. Step 602 may be similar to step 505 and in some cases may occur after step 502 of process 500. In some cases, step 602 includes initializing aircraft 101 as described steps 505 and/or 510.

After step 602, process 600 continues to step 604 where it is determined whether the electrical current IS to pad transmitter 263 is greater than a base threshold. Step 604 may be similar to determining whether an amount of current IS flowing to transmitter 263 is greater than a minimum current threshold (e.g., the base threshold) for powering controller 160 to perform the test sequence as described for step 550 of process 500.

If the electrical current is not greater than the base threshold at step 604, process 600 continues to step 610 where nominal colored lights are displayed at pad lights 272 and test system is not initialized. Step 610 may include controller 316 automatically sending signals to illuminate or blink lights 272 with nominal colored or blue light; and test system 100 not being initialized, such as by process 500 not continuing to step 510 or process 700 not continuing to step 704 as described below.

After step 610, process 600 continues to step 612 where test system 100 initialization failure is reported. This may include a test operator observing the lights 272 illuminated or blinking with the nominal colored or blue light from step 610 and discontinuing the test such as by powering down pad 201 and/or aircraft 101.

If the electrical current is greater than the base threshold at step 604, process 600 continues to step 606 where it is determined whether current IS to pad transmitter 263 is less than a maximum threshold. Step 606 may be similar to determining whether an amount of current IS flowing to transmitter 263 is less than a maximum current threshold indicating damage to systems 102 of the aircraft as described for step 560 of process 500.

If the electrical current is not less than a maximum threshold at step 606, process 600 continues to step 614 where overcurrent colored lights are displayed at pad lights 272 and wireless power transmission by transmitter 263 is discontinued. Step 614 may include controller 316 automatically sending signals to illuminate or blink lights 272 with overcurrent colored or red light; and sending signals to discontinue wireless power transmission by transmitter 263. This may also include process 500 not continuing to step 510 or process 700 not continuing to step 704 as described below.

After step 614, process 600 continues to step 616 where aircraft systems 102 failure is reported. This may include a test operator observing the lights 272 illuminated or blinking with the overcurrent colored or red light from step 614 and discontinuing the test such as by powering down pad 201 and/or aircraft 101. Step 616 may include determining that aircraft 101 is considered unfit to fly or perform.

If the electrical current is not than a maximum threshold at step 606, process 600 continues to step 608 where active test colored lights are displayed at pad lights 272 and wireless power transmission by transmitter 263 is continued. Step 608 may include controller 316 automatically sending signals to illuminate or blink lights 272 with active test colored or green light; and sending signals to continue wireless power transmission by transmitter 263. This may also include process 500 continuing to step 510 or process 700 continuing to step 704 as described below.

In some cases, process 600 only includes steps described as being performed by pad systems 202. In some embodiments, process 600 may only include steps 604-608. In some cases of process 600, step 602 is optional. For some embodiments of process 600, steps 612 and 616 are optional. In these cases, process 600 may be focused on the actions performed by test pad 201.

As noted above, embodiments of steps 505-540 of process 500 will now be further described at FIG. 7. For example, FIG. 7 is a flow chart describing one embodiment of process 700 for automatically initiating, performing and powering a test of aircraft 101 based on detected wireless power 280 at the aircraft. In some cases, process 700 is performed by aircraft systems 102, based on an amount of power 280 transmitted by pad systems 202.

Process 700 starts with step 702 where aircraft 101 is initialized. Step 702 may be similar to step 505 and in some cases may occur after step 502 of process 500. In some cases, step 702 includes initializing aircraft 101 as described steps 505 and/or 510.

After step 702, process 700 continues to step 704 where it is determined whether the test mode switch 350 is activated. Step 704 may be similar to determining whether determined whether the test mode switch 350 is activated or whether Vout 165 indicates the detection of receipt of the wireless power at aircraft 101 as described herein, such as for FIGS. 1-4A, for step 510 of process 500, or for steps 570-580 of process 565.

If it is not determined that the test mode switch 350 is activated at step 702, process 700 continues to step 706 where aircraft 101 may automatically maintain or switch to being powered by a battery of the aircraft (not shown), such as to initiate main flight control functions. This may include aircraft 101 determining that it is not receiving wireless power, aircraft battery power initialization of systems 102, and/or connecting to, switching to, or using a battery of the aircraft for powering controller 160, such as described herein.

Step 706 may include controller 160 automatically determining that aircraft 101 determining is not receiving wireless power, such as based on signal 175; and based on that detection, automatically maintaining or switching to being powered by a battery of the aircraft, and initiating main flight control functions.

If it is determined that the test mode switch 350 is activated at step 702, process 700 continues to step 708 where aircraft controller 160 is turned on and initiates a wireless power initiated test sequence to determine statuses of systems 102 of the aircraft is initiated based on the detection of receipt of the wireless power, as described herein, such as for FIGS. 1-4A, for step 520 of process 500, or for step 520 of process 565.

After step 708, process 700 continues to step 710 where it is determined whether all lighting segments of aircraft lights 172 are illuminating or blinking with colors of all of the main colors of those lights. At step 710, the lights may all illuminate with the same color at the same time, such as in response to receiving light control test sequence signals from controller 160 to exercise the light system having lights 172 of the aircraft by turning them on/off and selecting one or more colors of illumination. Step 710 may include a test operator observing whether the lights 172 illuminate and/or blink with the color(s) properly or as expected in response to receiving the test sequence signals. This observing may be visually detecting a readiness state of lights 172 or the system having lights 172 by seeing that all of the lights illuminate properly.

If it is determined that all lighting segments of aircraft lights 172 are not illuminating or blinking properly at step 708, process 700 continues to step 712 where a light segment 172 failure of systems 102 is reported. This failure may be reported by a test operator.

If it is determined that all lighting segments of aircraft lights 172 are illuminating or blinking properly at step 708, process 700 continues to step 714 where it is determined whether video transmitter (VTX) 162 is responding to a health check. At step 714, transmitter 162 may transmit and confirm transmission of video data signals, such as in response to a video transmitter test sequence signal from controller 160 to exercise the video transmitter system having transmitter 162. Step 714 may include controller 160 automatically determining whether the video transmitter 162 is responding to a health check properly by receiving an expected confirmation signal in response to sending the test sequence signal. This automatically determining may be detecting a readiness state of transmitter 162 or the system having transmitter 162 by receiving a proper or expected confirmation signal from the transmitter.

If it is determined that video transmitter 162 is not responding to a health check properly at step 714, process 700 continues to step 716 where a video transmitter 162 failure of systems 102 is reported. This failure may be reported by aircraft 101 or controller 160, such as to a test operator.

If it is determined that video transmitter 162 is responding to a health check properly at step 714, process 700 continues to step 718 where it is determined whether a system bus (SBUS) signal is present for control receiver 164. At step 718, controller 160 may determine whether receiver 164 is outputting a SBUS signal, by receiving that signal at controller 160. Receiving the signal may or may not be in response to a control receiver test sequence signal from controller 160 to exercise the control receiver system having receiver 164. In some cases, step 718 may include controller 160 automatically determining that receiver 164 is outputting a SBUS signal by receiving a proper SBUS signal. This automatically determining may be detecting a readiness state of receiver 164 or the system having receiver 164 by receiving a proper or expected SBUS signal from the receiver.

If it is determined that receiver 164 is not outputting a proper SBUS signal at step 718, process 700 continues to step 720 where a control receiver 164 failure of systems 102 is reported. This failure may be reported by aircraft 101 or controller 160, such as to a test operator.

If it is determined that receiver 164 is outputting a proper SBUS signal at step 718, process 700 continues to step 722 where it is determined whether camera 174 is responding to a health check. At step 722, video transmitter (VTX) 162 may determine whether camera 174 is outputting a healthy video data signal, by receiving that signal at transmitter 162. Receiving the signal may or may not be in response to transmitter 162 receiving a control camera test sequence signal from controller 160 to exercise the camera system having camera 174. In some cases, step 722 may include controller 160 automatically determining that camera 174 is outputting a video data signal and/or responding to a camera health check by receiving an expected confirmation signal from transmitter 162 in response to controller 160 sending the test sequence signal. The camera test sequence signal may be a video health (lock status) request that is different from the VTX health request that is for the VTX check at step 714. This automatic determining may be detecting a readiness state of camera 174 or the system having camera 174 by receiving a proper or expected confirmation signal from the transmitter 162.

If it is determined that camera 174 is not outputting a proper video data signal at step 722, process 700 continues to step 724 where a camera 174 failure of systems 102 is reported. This failure may be reported by aircraft 101 or controller 160, such as to a test operator.

If it is determined that camera 174 is outputting a proper video data signal at step 722, process 700 continues to step 726 where it is determined whether all (e.g., all 4) ESCs of aircraft 101 are connected and operating properly. For example, at step 726, ESCs 123, 133, 143 and 153 may be connected to battery power of the aircraft and activated to produce an output such as an audible tone or propulsion driver signal, such as in response to receiving ESC control test sequence signals from controller 160 to exercise the ESC systems having the ESCs. Step 726 may include a test operator listening to observe whether the ESCs output an audible tone or propulsion driver signal properly or as expected in response to receiving the ESC test sequence signals. This observing may be audio detecting a readiness state of the ESCs or the systems having the ESCs by hearing that all of the ESCs output the tone or signal properly.

If it is determined that all ESCs are not outputting an audible tone or propulsion driver signal properly at step 726, process 700 continues to step 728 where an ESC number failure of systems 102 is reported for the number any of the ESCs not properly outputting the signal, such as identifying an arm number for the failing ESC(s). This failure may be reported by a test operator.

If it is determined that all ESCs are outputting an audible tone or propulsion driver signal properly at step 726, process 700 continues to step 730 where it is determined whether all (e.g., all 4) propulsion sources (here, motors) of aircraft 101 spin properly. For example, at step 730, propulsion sources 127, 137, 147 and 157 may be connected to battery power of the aircraft and activated to produce an output of propulsion, such as a spin of a propeller attached to a motor in response to receiving motor control test sequence signals from controller 160 (such as via the ESCs) to exercise the motor systems having the motors. Step 730 may include a test operator observing whether the motors spin by seeing that propellers spin properly or as expected in response to receiving the motor test sequence signals. This observing may be visually detecting a readiness state of the motors or the systems having the motors by viewing that all of the motors spin properly.

If it is determined that not all of the motors spin properly at step 730, process 700 continues to step 732 where a motor number failure of systems 102 is reported for the number any of the motors not properly spinning, such as identifying an arm number for the failing motor(s). This failure may be reported by a test operator.

In some cases, step 716, 720 and/or 724 may include controller 160 causing lights 172 displaying test failure colored lights for video transmitter 162 failure, control receiver 164 failure and/or camera 174 failure, respectively. This may include controller 160 automatically sending signals to illuminate or blink lights 172 with a certain color and or blink sequence that identifies such a failure.

Also, step 712, 716, 720, 724, 728 and/or 732 may include a test operator discontinuing the test such as by powering down pad 201 and/or aircraft 101. They may also include determining that aircraft 101 is considered unfit to fly or perform.

If it is determined that all of the motors spin properly at step 730, process 700 continues to step 740 where completion of the wireless power initiated test sequence is reported. Step 730 may include system 100 successfully completing the test sequence and/or determining a readiness state of ready for systems 102 of the aircraft, as described herein, such as for FIGS. 1-4B, for step 540 of process 500.

In some cases, step 740 may include controller 160 causing lights 172 to display test pass colored lights for systems 102. This may include controller 160 automatically sending signals to illuminate or blink lights 172 with a certain color and or blink sequence that identifies such a test pass.

In some cases, process 700 only includes steps described as being performed by aircraft systems 102. For some embodiments, process 700 may only include steps 704, 708, 714, 716, 718, 720, 722, 724 and 740. In some cases of process 700, steps 702 and 706 are optional. For some embodiments of process 700, steps 712, 728 and 732 are optional. In these cases, process 700 may be focused on the actions performed by aircraft 101.

In some cases, steps 710-740 may include descriptions for powering the test sequence and determining if systems 102 are functioning proper or as expected in steps 522, 530 and 540 of FIG. 5. In some cases, after steps 540 and 560 of process 500, process 500 may continue to step 706 of process 700. In some cases, after steps 608 of process 600 and step 740 of process 700, process 700 may continue to step 706.

In some embodiments, descriptions herein of system 100, process 500, process 565, process 600 and/or process 700 apply to, test or result in testing of all of systems 102. In other embodiments, descriptions herein apply to, test or result in testing of fewer than all of systems 102. In some cases, descriptions herein apply to, test or result in testing of one or more of systems 102.

In some embodiments, controller 316 and/or controller 160 include or are also in communication with a RAM and/or ROM, which is a local volatile memory for that controller. This RAM and/or ROM can be any type of volatile storage (e.g., DRAM, SRAM, etc.). In one embodiment, this RAM and/or ROM stores code (software and/or firmware) that programs controller 316 and/or controller 160 to perform the functions described herein for initiating a test of aircraft 101 based on detection of wireless power at the aircraft. In another embodiment, controller 316 and/or controller 160 include custom hardware (FPGAs, ASICS, etc.), with or without software, to perform the functions described herein for initiating a test of aircraft 101 based on detection of wireless power at the aircraft.

In some cases, system 100 may be useful initiating a test of aircraft 101 based on detection of wireless power at an aircraft that is an unmanned aircraft such as a drone. In these cases, aircraft 101 may have physical, mechanical and electronic components of systems 102; 3 to 7 arms; and at least one source of propulsion (e.g., such as one source at the distal end of each arm). In some embodiments, the propulsion sources of aircraft 101 may be controlled by wireless signals received from a remote control device.

In other cases, system 100 may be useful initiating a test of aircraft 101 based on detection of wireless power at the aircraft that is a wire controlled aircraft, an airplane, a jet powered aircraft, a personal aircraft, a commercial aircraft, a rocket, or a spacecraft.

The above-discussion includes describing a wireless power initiated aircraft test system, an aircraft capable having a controller capable of being powered by received wireless power during performing of an automatic test of systems of the aircraft, and a method of wireless power initiating an aircraft test, each able to initiate and power a test sequence to determine statuses of systems of the aircraft, based on and using received wireless power detected at the aircraft. This will lead to less expensive, more accurate, faster, less complicated automated testing of aircraft systems.

One embodiment includes a wireless power initiated aircraft test system, comprising: a voltage regulator mounted on the aircraft, the voltage regulator configured to detect receiving wireless power from a source; and a controller mounted on the aircraft and electrically connected to the voltage regulator, the controller configured to initiate a test sequence to determine statuses of systems of the aircraft in response to receipt of the wireless power.

In one embodiment, the controller is powered during conducting of the test sequence by the wireless power received by the voltage regulator.

In one embodiment, the test system further comprises: a wireless power receiver mounted on the aircraft and electrically connected to the voltage regulator, the wireless power receiver configured to detect a power signature of the received wireless power; and wherein: the voltage regulator is configured to detect an amount of power of the received wireless power; and the voltage regulator is configured to switch on the controller based on the wireless power receiver detecting that the power signature of the received wireless power matches a power signature of the wireless power receiver, and the voltage regulator detecting that the amount of power of the received wireless power exceeds a threshold amount of power.

One embodiment includes an aircraft, comprising: a wireless power receiver configured to receive inductive wireless power; and a controller electrically connected to the wireless power receiver, the controller configured to be powered by the received inductive wireless power during performing of an automatic test of systems of the aircraft.

One embodiment includes a method of wireless power initiating an aircraft test, comprising: automatically detecting received wireless power at an aircraft; and initiating a test sequence at the aircraft to determine statuses of systems of the aircraft in response to detecting the received wireless power at the aircraft.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "type" of objects may refer to a "type" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. A wireless power initiated aircraft test system for an aircraft, comprising:
   a receiver configured to receive wireless power and provide a received output signal from the received wireless power;
   a voltage regulator mounted on the aircraft and configured to receive the received output signal from the receiver, the voltage regulator comprises:
      a first voltage converter configured to receive the received output signal as an input to the first voltage converter and configured to provide a first output from the first voltage converter that is a higher voltage than the received output signal,
      a second voltage converter configured to receive the received output signal as an input to the second voltage converter and configured to provide a second output from the second voltage converter that is based on the received output signal, and
      a switch configured to receive the received output signal as a first input to the switch and a bias voltage as a second input to the switch, the switch is configured to provide the bias voltage as a third output from the switch if the received output signal is less than a threshold voltage and provide a voltage lower than the bias voltage as the third output from the switch if the received output signal is greater than the threshold voltage;
   a battery; and
   a controller mounted on the aircraft and electrically connected to the voltage regulator and the battery, the controller is connected to the first output from the first voltage converter as well as the second output from the second voltage converter and the third output from the switch, the controller is configured to control systems on the aircraft, the controller is configured to be powered by the battery during flight of the aircraft, the voltage regulator is configured to turn on the controller via the third output and supply power from the wireless power to the controller via the first output and the second output in response to the switch detecting that the received output signal is greater than the threshold voltage, the controller is configured to automatically initiate a test sequence to determine status of systems of the aircraft other than the battery in response to the voltage regulator turning on the controller via the third output and supplying power via the first output and the second output, the controller is configured to be powered by the wireless power rather than by the battery during the test sequence.

2. The system of claim 1, wherein:
   the receiver includes an inductor coil configured to detect that a power signature of the received wireless power matches the power signature of the wireless power receiver by determining that a received frequency range of near field, inductively transmitted wireless power matches a frequency range for near field, inductively transmitted wireless power that the wireless power receiver is capable of receiving.

3. The system of claim 1, further comprising:
   a test pad, the test pad includes:
      a wireless power transmitter configured to transmit the wireless power; and a current detector circuit electrically connected to the wireless power transmitter, the current detector circuit configured to detect whether an amount of electrical current flowing to the wireless power transmitter is greater than a minimum current threshold for powering the controller, and is less than a maximum current threshold indicating damage to the systems of the aircraft.

4. An aircraft, comprising:

a wireless power receiver configured to receive inductive wireless power and configured to output a received voltage based on the wireless power;

a voltage regulator connected to the wireless power receiver and configured to receive the received voltage, the voltage regulator comprises:

a voltage converter configured to receive the received voltage as an input to the voltage converter and configured to provide a first output from the voltage converter that is based on the received voltage, and a switch transistor having a gate as well as a source and a drain, the gate is connected to the wireless power receiver and configured to receive the received voltage, the source is connected to a bias voltage and a switch output, the drain is connected to ground, the switch transistor is configured to provide the bias voltage as the switch output if the received voltage is less than a threshold voltage and provide ground as the switch output if the received voltage is greater than the threshold voltage; and a controller electrically connected to the first output from the voltage converter and the switch output, the controller is configured to perform an automatic test of systems of the aircraft other than the battery and be powered by the first output from the voltage converter based on the received voltage rather than by a battery during performing of the automatic test of systems of the aircraft other than the battery in response to receiving ground as the switch output.

5. The system of claim 1, wherein:

the controller is configured to automatically initiate the test sequence to determine status of a propulsion system of the aircraft in response to the voltage regulator turning on the controller via the third output and supplying power via the first output and the second output.

6. The system of claim 1, wherein:

the controller is configured to automatically initiate the test sequence to determine status of any one of the aircraft's propulsion system, video camera, flight control system and communication system.

7. The system of claim 1, wherein:

the voltage regulator is configured to receive the wireless power as the received output signal and transmit the received wireless power to the controller without going through a battery.

8. The system of claim 1, wherein:

the controller is further configured to control a propulsion system for the aircraft when not performing the test sequence.

9. The system of claim 1, wherein:

the switch includes a third input connected to ground, the voltage lower than the bias voltage is 0 volts.

10. The system of claim 1, wherein:

the switch includes a transistor having a gate connected to the received output signal, a source connected to the bias voltage and the third output, and a drain connected to ground; and the voltage lower than the bias voltage is 0 volts.

11. The system of claim 1, wherein:

the second output from the second voltage converter is equal in voltage magnitude to the received output signal.

12. The system of claim 1, wherein:

the controller is configured to be powered by the battery via the voltage regulator during flight of the aircraft.

* * * * *